United States Patent
Yokokawa et al.

(10) Patent No.: US 7,657,820 B2
(45) Date of Patent: Feb. 2, 2010

(54) DECODING DEVICE AND DECODING METHOD

(75) Inventors: Takashi Yokokawa, Kanagawa (JP); Yuji Shinohara, Tokyo (JP); Osamu Shinya, Tokyo (JP)

(73) Assignee: Sony Corporation, Tokyo (JP)

( * ) Notice: Subject to any disclaimer, the term of this patent is extended or adjusted under 35 U.S.C. 154(b) by 717 days.

(21) Appl. No.: 11/409,237

(22) Filed: Apr. 24, 2006

(65) Prior Publication Data
US 2006/0242536 A1    Oct. 26, 2006

(30) Foreign Application Priority Data
Apr. 25, 2005    (JP) ............................ P2005-125963

(51) Int. Cl.
*H03M 13/00*    (2006.01)
(52) U.S. Cl. ...................................... 714/755; 714/786
(58) Field of Classification Search .................. 714/755, 714/786
See application file for complete search history.

(56) References Cited

U.S. PATENT DOCUMENTS

| | | | |
|---|---|---|---|
| 6,985,536 B2 * | 1/2006 | Oelcer et al. | 375/261 |
| 7,055,090 B2 * | 5/2006 | Kikuchi et al. | 714/801 |
| 7,299,397 B2 * | 11/2007 | Yokokawa et al. | 714/752 |

* cited by examiner

*Primary Examiner*—Guy J Lamarre
(74) *Attorney, Agent, or Firm*—Finnegan, Hendeson, Farabow, Garrett & Dunner, L.L.P.

(57) ABSTRACT

A decoding device for decoding an LDPC (Low Density Parity Check) code. The decoding device may include a first operation unit for performing a check node operation for decoding the LDPC code, the operation including an operation of a nonlinear function and an operation of an inverse function of the nonlinear function; and a second operation unit for performing a variable node operation for decoding the LDPC code. The first operation unit includes a first converting unit for converting a first quantization value assigned to a numerical value into a second quantization value representing a numerical value with a higher precision than the first quantization value, and a second converting unit for converting the second quantization value into the first quantization value.

7 Claims, 18 Drawing Sheets

FIG.1

$$H = \begin{bmatrix} & & & \vdots & & & & & \\ \cdots 1 \cdots 1 \cdot & 1 & \cdots \cdots 1 \cdots 1 \cdots 1 \\ & & & 1 & & & & & \\ & & & \vdots & & & & & \\ & & & 1 & & & & & \end{bmatrix}$$

FIG.2

$$H = \begin{bmatrix} \overbrace{\phantom{xxxxxxxxxxx}}^{\text{INFORMATION PART}} & \overbrace{\phantom{xxxxxx}}^{\text{PARITY PART}} \\ 1 \quad 1 \quad 1 \quad\quad 1 \quad\;\; 1 \quad\quad\quad\quad \\ \quad\;\; 1 \quad 1 \quad\quad 1 \quad 1 \;\; 1\,1 \quad\quad 0 \\ \quad\quad\quad \vdots \quad\quad\quad\quad\quad \vdots \quad\quad\quad \end{bmatrix}$$

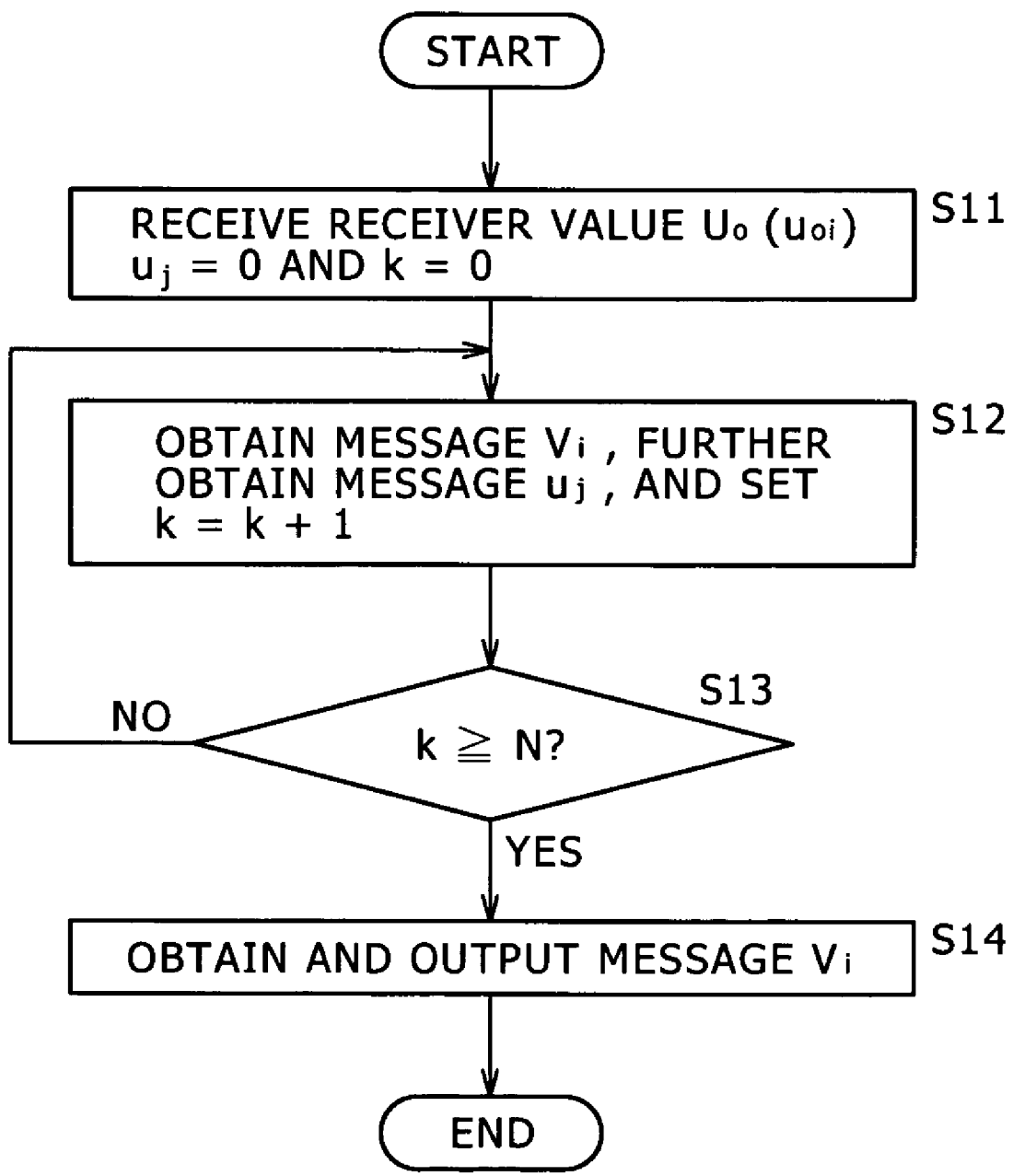

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

CHECK NODE

VARIABLE NODE

FIG. 9

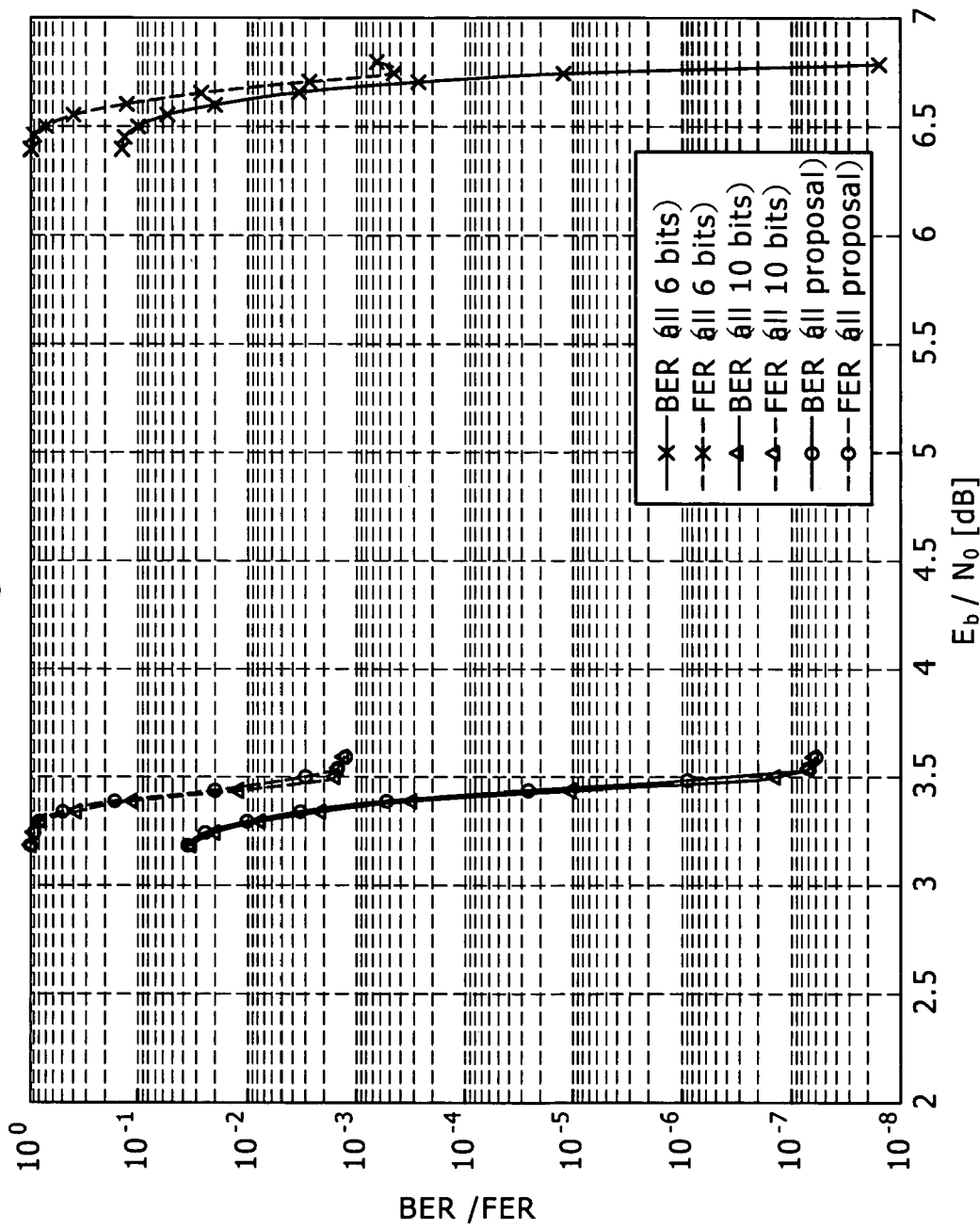

DECODING DEVICE AND DECODING METHOD

CROSS REFERENCES TO RELATED APPLICATIONS

The present invention contains subject matter related to Japanese Patent Application JP 2005-125963 filed in the Japanese Patent Office on Apr. 25, 2005, the entire contents of which being incorporated herein by reference.

BACKGROUND OF THE INVENTION

The present invention relates to a decoding device and a decoding method, and particularly to a decoding device and a decoding method that make it possible to decode a code resulting from encoding by a low density parity check code (LDPC code) with a high precision while preventing an increase in scale of the device.

Recently, researches in a field of communications such as mobile communications and deep space communications and in a field of broadcasting such as terrestrial broadcasting and satellite digital broadcasting, for example, have been advanced considerably. As such researches have been advanced, researches into coding theories have also been actively pursued for purposes of improvement in efficiency of error correction coding and decoding.

A so-called Shannon (C. E. Shannon) limit given by Shannon's channel coding theorem is known as a theoretical limit of code performance. Researches into coding theories are pursued with an objective of developing a code that offers performance close to the Shannon limit. Recently, methods referred to as turbo coding such as PCCCs (Parallel Concatenated Convolutional Codes) and SCCCs (Serially Concatenated Convolutional Codes), for example, have been developed as encoding methods that offer performance close to the Shannon limit. While these turbo codes have been developed, low density parity check codes (hereinafter referred to as LDPC codes) as an encoding method that has been known for a long time are drawing attention.

LDPC codes were first proposed by R. G. Gallager in "Low Density Parity Check Codes", Cambridge, Mass.: M. I. T. Press, 1963. Thereafter LDPC codes were rediscovered in D. J. C. MacKay, "Good error correcting codes based on very sparse matrices", submitted to IEEE Trans. Inf. Theory, IT-45, pp. 399-431, 1999, M. G. Luby, M. Mitzenmacher, M. A. Shokrollahi, and D. A. Spielman, "Analysis of low density codes and improved designs using irregular graphs", in Proceedings of ACM Symposium on Theory of Computing, pp. 249-258, 1998, and the like.

Recent researches have found that, as with turbo codes and the like, LDPC codes offer performance that approaches the Shannon limit as code length is increased. Since LDPC codes have a characteristic in that minimum distance is in proportion to the code length, the LDPC code has advantages, as features thereof, of good block error probability characteristics and substantially no occurrence of a so-called error floor phenomenon, which is observed in characteristics of decoding of turbo codes and the like.

Such LDPC codes will be described concretely in the following. Incidentally, LDPC codes are linear codes, and are not necessarily binary codes; however, the following description will be made supposing that LDPC codes are binary codes.

LDPC codes have a principal characteristic in that a parity check matrix defining the LDPC codes is a sparse check matrix. A sparse matrix has a very small number of "1s" as components of the matrix. Supposing that a sparse check matrix is represented by H, such check matrices H include for example a check matrix H as shown in FIG. 1 in which the Hamming weight (the number of 1s) of each column is three and the Hamming weight of each row is six.

An LDPC code defined by such a check matrix H in which the Hamming weights of each row and each column are constant is referred to as a regular LDPC code. On the other hand, an LDPC code defined by a check matrix H in which the Hamming weights of each row and each column are not constant is referred to as an irregular LDPC code.

Encoding by such an LDPC code is implemented by generating a generator matrix G based on the check matrix H and multiplying the generator matrix G by a binary information message to generate a codeword. Specifically, an encoding device for performing encoding by an LDPC code first calculates a generator matrix G which satisfies an equation $GH^T=0$ between a transposed matrix $H^T$ of the check matrix H and the generator matrix G. When the generator matrix G is a k×n matrix (a matrix of k rows and n columns), the check matrix H is a matrix of n−k rows and n columns.

The encoding device multiplies the generator matrix G by an information message (vector) u of k bits to generate a codeword (LDPC code) c (=uG) of n bits. The codeword c generated by the encoding device is mapped such that a code bit having a value "0" is converted into "+1" and a code bit having a value "1" is converted into "−1" for transmission. The transmitted codeword is received on a receiving side via a predetermined communication channel.

In a case where the codeword c of n bits is a systematic code that coincides with a bit string obtained by arranging n−k parity bits following the information message u of k bits, supposing that a part of n−k rows and k columns in the check matrix H of n−k rows and n columns which part corresponds to the information message u of k bits in the codeword c of n bits is referred to as an information part and that a part of n−k rows and n−k columns which part corresponds to n−k parity bits is referred to as a parity part, the information message u can be encoded into an LDPC code by using the check matrix H when the parity part forms a lower triangular matrix or an upper triangular matrix.

Specifically, for example, when the check matrix H is formed by the information part and the parity part of a lower triangular matrix as shown in FIG. 2, and elements in the lower triangular part of the parity part all have a value of one, a first bit of the parity bits of the codeword c has a value obtained by calculating an EXOR (exclusive disjunction) of bits of the information message u which bits correspond to elements having a value of one in a first row in the information part of the check matrix H.

A second bit of the parity bits of the codeword c has a value obtained by calculating an EXOR of bits of the information message u which bits correspond to elements having a value of one in a second row in the information part of the check matrix H and the first bit of the parity bits.

A third bit of the parity bits of the codeword c has a value obtained by calculating an EXOR of bits of the information message u which bits correspond to elements having a value of one in a third row in the information part of the check matrix H and the first and second bits of the parity bits.

Similarly, a subsequent ith bit of the parity bits of the codeword c has a value obtained by calculating an EXOR of bits of the information message u which bits correspond to elements having a value of one in an ith row in the information part of the check matrix H and the first to (i−1)th bits of the parity bits.

Thus, the codeword c of n bits can be obtained by determining the n−k parity bits and arranging the n−k parity bits following the information message u of k bits.

LDPC codes can be decoded by a probabilistic decoding algorithm proposed by Gallager, which is a message-passing algorithm based on belief propagation on a so-called Tanner graph including variable nodes (referred to also as message nodes) and check nodes. Variable nodes and check nodes will hereinafter be also referred to simply as nodes as appropriate.

In the probabilistic decoding, however, messages exchanged among nodes are real numbers, and it is therefore necessary to monitor the probability distribution itself of the messages assuming sequential numbers in order to analytically solve the messages. Thus, very difficult analysis is required. Therefore, Gallager has proposed algorithm A or algorithm B as an algorithm for decoding LDPC codes.

LDPC codes are generally decoded according to a procedure as represented in FIG. 3. In this case, suppose that an LDPC code (codeword c) received value is U0, that a message output from a check node (hereinafter referred to as a check node message as appropriate) is uj, and that a message output from a variable node (hereinafter referred to as a variable node message as appropriate) is vi. A message is a real number that expresses the likelihood of zero by a so-called log likelihood ratio. Further, the log likelihood ratio of the likelihood of zero of the received value U0 will be represented as received data u0i.

In the decoding of an LDPC code, as shown in FIG. 3, in first step S11, the received value U0 (received data u0i) is received, the message uj is initialized to "0", and a variable k of an iterative processing counter which variable assumes an integer is initialized to "0". The process proceeds to step S12. In step S12, the variable node message vi is obtained by performing an operation represented by Equation (1) on the basis of the received data u0i, and the check node message uj is obtained by performing an operation represented by Equation (2) on the basis of the variable node message vi.

[Equation 1]

$$v_i = u_{0i} + \sum_{j=1}^{d_v-1} u_j \quad (1)$$

[Equation 2]

$$\tanh\left(\frac{u_j}{2}\right) = \prod_{i=1}^{d_c-1} \tanh\left(\frac{v_i}{2}\right) \quad (2)$$

In Equations (1) and (2), dv and dc are arbitrarily selectable parameters representing the number of 1s in a vertical direction (row direction) and a horizontal direction (column direction), respectively, of the check matrix H. For example, in a case of a (3, 6) code, dv=3 and dc=6.

Incidentally, in the operation of Equation (1) or (2), a message input from an edge from which to output a message is not used as a product or sum operation parameter, and therefore a product or sum operation range is a range of one to dv−1 or one to dc−1. In practice, the operation represented by Equation (2) is performed by preparing in advance a table of a function R(v1, v2) represented by Equation (3), which is defined by one output with respect to two inputs v1 and v2, and sequentially (recursively) using the function R as shown in Equation (4).

[Equation 3]

$$x = 2 \tan h^{-1}\{\tan h(v_1/2) \tan h(v_2/2)\} = R(v_1, v_2) \quad (3)$$

[Equation 4]

$$u_j = R(v_1, R(v_2, R(v_3, \ldots R(v_{d_c-2}, v_{d_c-1})))) \quad (4)$$

Further, in step S12, the variable k is incremented by one. The process proceeds to step S13. In step S13, whether the variable k is equal to or greater than predetermined iterative decoding times N is determined. When it is determined in step S13 that the variable k is not equal to or greater than N, the process returns to step S12 to thereafter repeat the same processing.

When it is determined in step S13 that the variable k is equal to or greater than N, the process proceeds to step S14, where a message v as a decoding result to be finally output is obtained by performing an operation represented by Equation (5), and the message v is output. Then the LDPC code decoding process is ended.

[Equation 5]

$$v = u_{0i} + \sum_{j=1}^{d_v} u_j \quad (5)$$

Unlike the operation of Equation (1), the operation of Equation (5) is performed using messages from all edges connected to the variable node.

In such decoding of an LDPC code, in the case of a (3, 6) code, for example, messages are exchanged between nodes as shown in FIG. 4. The operation represented by Equation (1) is performed at the nodes indicated by "=" (variable nodes) in FIG. 4, and the operation represented by Equation (2) is performed at the nodes indicated by "+" (check nodes). In particular, in the algorithm A, messages are binarized, and at a node indicated by "+", an exclusive OR of dc−1 messages input to the node are calculated, and at a node indicated by "=", when all of dv−1 messages input to the node have bit values different from the received data R (u0i), the code is inverted and then output.

On the other hand, researches into a method for implementing the decoding of LDPC codes have recently been pursued. Prior to the description of the implementing method, description will first be made of the decoding of an LDPC code in schematic form.

FIG. 5 shows an example of the parity check matrix of a (3, 6) LDPC code (an encoding rate of 1/2 and a code length of 12). The check matrix H of an LDPC code can be written by using a Tanner graph as in FIG. 6. In FIG. 6, a check node is denoted by "+", and a variable node is denoted by "=". A check node and a variable node correspond to a row and a column, respectively, of the check matrix H. A connection between a check node and a variable node is an edge, and corresponds to "1" in the check matrix. Specifically, when a component in a jth row and an ith column in the check matrix H is one, an ith variable node from the top (a "=" node) and a jth check node from the top (a "+" node) in FIG. 6 are connected to each other by an edge. The edge indicates that an LDPC code bit corresponding to the variable node has a constraint condition corresponding to the check node. Incidentally, FIG. 6 is a Tanner graph of the check matrix H of FIG. 5.

A sum-product algorithm as an LDPC code decoding method repeatedly performs a variable node operation and a check node operation.

The operation of Equation (1) is performed at a variable node as shown in FIG. 7. Specifically, in FIG. 7, a variable node message vi corresponding to an edge for which to calculate the variable node message vi is calculated using received information u0i and check node messages u1 and u2 from other edges connected to the variable node. Variable node messages corresponding to other edges are calculated in a similar manner.

Prior to the description of the check node operation, Equation (2) is rewritten as Equation (6) using the relation of an equation a×b=exp{ln(|a|)+ln(|b|)}×sign(a)×sign(b), where sign(x) is 1 when x≧0, and is −1 when x<0.

[Equation 6]

$$u_j = 2\tanh^{-1}\left(\prod_{i=1}^{d_c-1} \tanh\left(\frac{v_i}{2}\right)\right) \quad (6)$$

$$= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right]$$

$$= 2\tanh^{-1}\left[\exp\left\{-\left(\sum_{i=1}^{d_c-1} -\ln\left(\tanh\left(\frac{|v_i|}{2}\right)\right)\right)\right\}\right] \times \prod_{i=1}^{d_c-1} \text{sign}(v_i)$$

Further, when a nonlinear function φ(x) is defined as an equation φ(x)=ln(tan h(x/2)) (ln( ) is a natural logarithmic function) with x≧0, the inverse function φ−1(x) of the nonlinear function φ(x) is expressed by an equation φ−1(x)=2tan h−1(e−x). Therefore Equation (6) can be written as Equation (7).

[Equation 7]

$$u_j = \phi^{-1}\left(\sum_{i=1}^{d_c-1} \phi(|v_i|)\right) \times \prod_{i=1}^{d_c-1} \text{sign}(v_i) \quad (7)$$

The operation of Equation (7) is performed at a check node as shown in FIG. 8. Specifically, in FIG. 8, a check node message uj corresponding to an edge for which to calculate the check node message uj is calculated using variable messages v1, v2, v3, v4, and v5 from other edges connected to the check node. Check node messages corresponding to other edges are calculated in a similar manner.

Incidentally, the function φ(x) can also be expressed as φ(x)=ln((ex+1)/(ex−1)), and φ(x)=φ−1(x) when x>0. When the functions φ(x) and φ−1(x) are implemented in hardware, the functions φ(x) and φ−1(x) may be implemented by using a LUT (Look Up Table), and in such a case, an identical LUT is used for both of the functions φ(x) and φ−1(x).

The LDPC code decoding method is referred to not only as the sum-product algorithm but also as belief propagation, for example; however, operations performed in either case are the same.

An implementing method in a case of performing decoding by sequentially performing operations at nodes one by one (full serial decoding) will be described as an example of implementation of the sum-product algorithm in a decoding device.

Incidentally, when implementing the sum-product algorithm in hardware, it is necessary to perform the variable node operation represented by Equation (1) and the check node operation represented by Equation (7) repeatedly with an appropriate circuit scale and an appropriate operating frequency.

Suppose in this case that a code (an encoding rate of 2/3 and a code length of 108) represented by a check matrix H of 36 (rows)×108 (columns) in FIG. 9 is decoded, for example. The number of 1s in the check matrix H of FIG. 9 is 323, and therefore the number of edges in the Tanner graph is 323. In the check matrix of FIG. 9, zero is represented by ".".

FIG. 10 shows an example of configuration of a decoding device that performs one-time decoding of an LDPC code.

The decoding device of FIG. 10 calculates a message corresponding to one edge for each clock for operation of the decoding device.

Specifically, the decoding device in FIG. 10 includes two edge memories 100 and 102, one check node calculator 101, one variable node calculator 103, one receiver memory 104, and one controlling unit 105.

In the decoding device of FIG. 10, messages are read from the edge memory 100 or 102 one by one, and a message corresponding to a desired edge is calculated using the messages. Messages obtained by the calculation are stored one by one in the edge memory 102 or 100 in a subsequent stage. Iterative decoding is achieved by serially connecting a plurality of decoding devices of FIG. 10 that perform the one-time decoding, or repeatedly using the decoding device of FIG. 10. Incidentally, suppose in this case that a plurality of decoding devices of FIG. 10 are connected to each other.

The edge memory 100 stores messages (variable node messages) D100 supplied from the variable node calculator 103 of a decoding device in a preceding stage (not shown) in order in which the check node calculator 101 reads the messages D100. Then, in a phase of check node calculation, the edge memory 100 supplies the check node calculator 101 with the messages D100 as messages D101 in the order in which the messages D100 are stored.

According to a control signal D106 supplied from the controlling unit 105, the check node calculator 101 performs an operation (check node operation) according to Equation (7) using the messages D101 (variable node messages vi) supplied from the edge memory 100. The check node calculator 101 supplies a message D102 (check node message uj) obtained by the operation to the edge memory 102 in a subsequent stage.

The edge memory 102 stores messages D102 supplied from the check node calculator 101 in a preceding stage in order in which the variable node calculator 103 in a subsequent stage reads the messages D102. Then, in a phase of variable node calculation, the edge memory 102 supplies the variable node calculator 103 with the messages D102 as messages D103 in the order in which the messages D102 are stored.

Further, the variable node calculator 103 is supplied with a control signal D107 from the controlling unit 105, and supplied with received data D104 from the receiver memory 104. According to the control signal D107, the variable node calculator 103 performs an operation (variable node operation) according to Equation (1) using the messages D103 (check node messages uj) supplied from the edge memory 102 and the received data D104 (received data u0i) supplied from the receiver memory 104. The variable node calculator 103 supplies a message D105 (variable node message vi) obtained as a result of the operation to the edge memory 100 of a decoding device in a subsequent stage not shown in the figure.

The receiver memory 104 stores the received data u0i of the LDPC code. The controlling unit 105 supplies the control signal D106 for controlling the check node operation and the control signal D107 for controlling the variable node operation to the check node calculator 101 and the variable node calculator 103, respectively. The controlling unit 105 supplies the control signal D106 to the check node calculator 101 when the messages of all edges are stored in the edge memory 100, and supplies the control signal D107 to the variable node calculator 103 when the messages of all edges are stored in the edge memory 102.

FIG. 11 shows an example of configuration of the check node calculator 101 in FIG. 10 that performs the check node operation on a one-by-one basis.

Incidentally, FIG. 11 shows the check node calculator 101 supposing that each message is quantized into a total of six bits including a sign bit (a bit representing a positive sign or a negative sign). That is, a message is represented by a six-bit quantization value assigned to each numerical value for uniformly dividing a predetermined numerical range into 64 values that can be represented by six bits including a sign bit.

In FIG. 11, the check node operation on the LDPC code represented by the check matrix H of FIG. 9 is performed. Further, the check node calculator 101 in FIG. 11 is supplied with a clock ck. The clock ck is supplied to necessary blocks. The blocks perform processing in synchronism with the clock ck.

According to a one-bit control signal D106, for example, supplied from the controlling unit 105, the check node calculator 101 in FIG. 11 performs the operation according to Equation (7) using the messages D101 (variable node messages vi) read one by one from the edge memory 100.

Specifically, a six-bit message D101 (variable node message vi) from a variable node corresponding to each column in the check matrix H is input one by one to the check node calculator 101. An absolute value D122 (|vi|), which is five less significant bits of the message D101, is supplied to a LUT 121, and a sign bit D121, which is the most significant bit of the message D101, is supplied to an EXOR circuit 129 and a FIFO (First In First Out) memory 133. The check node calculator 101 is also supplied with the control signal D106 from the controlling unit 105. The control signal D106 is supplied to a selector 124 and a selector 131.

The LUT 121 reads a five-bit operation result D123 ($\phi(|vi|)$) obtained by performing the operation of the nonlinear function $\phi(|vi|)$ in Equation (7) in response to the absolute value D122 (|vi|). The LUT 121 supplies the five-bit result D123 ($\phi(|vi|)$) to an arithmetic unit 122 and a FIFO memory 127.

The arithmetic unit 122 integrates the five-bit operation result D123 ($\phi(|vi|)$) by adding the operation result D123 to a nine-bit value D124 stored in a register 123. The arithmetic unit 122 re-stores a resulting nine-bit integrated value in the register 123. Incidentally, when results D123 of operation on the absolute values D122 (|vi|) of messages D101 from all edges over one row of the check matrix H are integrated, the register 123 is reset.

The arithmetic unit 122 and the register 123 integrate the five-bit operation result D123 ($\phi(|vi|)$) supplied from the LUT 121 a number of times that, at a maximum, corresponds to a maximum number of delays in the FIFO memory 127, that is, a maximum row weight of the check matrix H. The maximum row weight of the check matrix H in FIG. 9 is nine. Hence, the arithmetic unit 122 and the register 123 integrate the five-bit operation result D123 ($\phi(|vi|)$) nine times at a maximum (perform integration for nine five-bit values). Thus, in order to be able to represent a value obtained by integrating the five-bit value nine times, the number of quantization bits in the output of the arithmetic unit 122 and subsequent outputs is nine, which is larger by four (a minimum number of bits that can represent nine (times)) than that of the five-bit operation result D123 ($\phi(|vi|)$) output by the LUT 121.

When the messages D101 (variable node messages vi) over one row of the check matrix are read one by one, and an integrated value obtained by integrating operation results D123 for one row is stored in the register 123, the control signal D106 supplied from the controlling unit 105 is changed from zero to one. For example, in a case where the row weight of the check matrix is "9", the control signal D106 is "0" for a first to an eighth clock, and is "1" for a ninth clock.

When the control signal D106 is "1", the selector 124 selects the value stored in the register 123, that is, the nine-bit integrated value D124 ($\Sigma\phi(|vi|)$ from i=1 to i=dc) obtained by integrating $\phi(|vi|)$ obtained from the messages D101 (variable node messages vi) from all the edges over one row of the check matrix H, and then outputs the value as a value D125 to the register 125 to store the value D125 in the register 125. The register 125 supplies the value D125 stored therein as a nine-bit value D126 to the selector 124 and an arithmetic unit 126. When the control signal D106 is "0", the selector 124 selects the value D126 supplied from the register 125, and then outputs the value D126 to the register 125 to re-store the value D126 in the register 125. That is, until $\phi(|vi|)$ obtained from the messages D101 (variable node messages vi) from all the edges over one row of the check matrix H is integrated, the register 125 supplies previously integrated $\phi(|vi|)$ to the selector 124 and the arithmetic unit 126.

Meanwhile, the FIFO memory 127 delays the five-bit operation result D123 ($\phi(|vi|)$) output by the LUT 121 until the new value D126 ($\Sigma\phi(|vi|)$ from i=1 to i=dc) is output from the register 125, and then supplies the five-bit operation result D123 ($\phi(|vi|)$) as a five-bit value D127 to the arithmetic unit 126. The arithmetic unit 126 subtracts the value D127 supplied from the FIFO memory 127 from the value D126 supplied from the register 125. The arithmetic unit 126 supplies a result of the subtraction as a five-bit subtraction value D128 to a LUT 128. That is, the arithmetic unit 126 subtracts $\phi(|vi|)$ obtained from a message D101 (variable node message vi) from an edge for which a check node message uj is desired to be obtained from the integrated value of $\phi(|vi|)$ obtained from the messages D101 (variable node messages vi) from all the edges over one row of the check matrix H. The arithmetic unit 126 supplies the subtraction value ($\Sigma\phi(|vi|)$ from i=1 to i=dc−1) as the subtraction value D128 to the LUT 128.

Incidentally, since the arithmetic unit 126 subtracts the five-bit value D127 supplied from the FIFO memory 127 from the nine-bit value D126 supplied from the register 125, the result of the subtraction can be nine bits at a maximum, whereas the arithmetic unit 126 outputs the five-bit subtraction value D128. Therefore, when the result of the subtraction of the five-bit value D127 supplied from the FIFO memory 127 from the nine-bit value D126 supplied from the register 125 cannot be represented by five bits, that is, when the result of the subtraction exceeds a maximum value (31 (11111 as a binary number) that can be represented by five bits, the arithmetic unit 126 clips the result of the subtraction to the maximum value that can be represented by five bits, and then outputs the five-bit subtraction value D128.

The LUT 128 outputs a five-bit operation result D129 ($\phi-1(\Sigma\phi(|vi|))$) obtained by performing the operation of the inverse function $\phi-1(\Sigma\phi(|vi|))$ in Equation (7) in response to the subtraction value D128 ($\Sigma\phi(|vi|)$ from i=1 to i=dc−1).

In parallel with the above processing, an EXOR circuit 129 calculates an exclusive OR of a one-bit value D131 stored in a register 130 and the sign bit D121, and thereby multiplies the sign bits together. The EXOR circuit 129 re-stores a one-bit multiplication result D130 in the register 130. Incidentally, when the sign bits D121 of messages D101 (variable node messages vi) from all edges over one row of the check matrix H are multiplied together, the register 130 is reset.

When a multiplication result D130 (Πsign(vi) from i=1 to dc) obtained by multiplying together the sign bits D121 of the messages D101 from all the edges over one row of the check matrix H is stored in the register 130, the control signal D106 supplied from the controlling unit 105 is changed from zero to one.

When the control signal D106 is "1", the selector 131 selects the value stored in the register 130, that is, the value D131 (Πsign(vi) from i=1 to i=dc) obtained by multiplying together the sign bits D121 of the messages D101 from all the edges over one row of the check matrix H, and then outputs the value D131 as a one-bit value D132 to a register 132 to store the value D132 in the register 132. The register 132 supplies the value D132 stored therein as a one-bit value D133 to the selector 131 and an EXOR circuit 134. When the control signal D106 is "0", the selector 131 selects the value D133 supplied from the register 132, and then outputs the value D133 to the register 132 to re-store the value D133 in the register 132. That is, until the sign bits D121 of the messages D101 (variable node messages vi) from all the edges over one row of the check matrix H are multiplied together, the register 132 supplies a previously stored value to the selector 131 and the EXOR circuit 134.

Meanwhile, the FIFO memory 133 delays the sign bit D121 until the new value D133 (Πsign(vi) from i=1 to i=dc) is output from the register 132 to the EXOR circuit 134, and then supplies the sign bit D121 as a one-bit value D134 to the EXOR circuit 134. The EXOR circuit 134 calculates an exclusive OR of the value D133 supplied from the register 132 and the value D134 supplied from the FIFO memory 133, and thereby divides the value D133 by the value D134. The EXOR circuit 134 then outputs a one-bit division result as a divided value D135. That is, the EXOR circuit 134 divides the value obtained by multiplying together the sign bits D121 (sign(|vi|)) of the messages D101 from all the edges over one row of the check matrix H by a sign bit D121 (sign (vi)) of a message D101 from an edge for which a check node message uj is desired to be obtained. The EXOR circuit 134 supplies the divided value (Πsign(vi) from i=1 to i=dc−1) as the divided value D135.

The check node calculator 101 then outputs, as a message D102 (check node message uj), a total of six bits with the five-bit operation result D129 output from the LUT 128 as five less significant bits and the one-bit divided value D135 output from the EXOR circuit 134 as a most significant bit (sign bit).

As described above, the check node calculator 101 performs the operations of Equation (7), and thereby obtains the check node message uj.

Incidentally, since the maximum row weight of the check matrix H of FIG. 9 is nine, that is, since the maximum number of variable node messages vi supplied to the check node is nine, the check node calculator 101 has the FIFO memory 127 for delaying results (φ(|vi|)) of the operation of the nonlinear function on nine variable node messages vi and the FIFO memory 133. When a check node message uj for a row with a row weight of less than nine is to be calculated, an amount of delay in the FIFO memory 127 and the FIFO memory 133 is reduced to the value of the row weight.

FIG. 12 shows an example of configuration of the variable node calculator 103 in FIG. 10 that performs the variable node operation on a one-by-one basis.

Incidentally, as with FIG. 11, FIG. 12 shows the variable node calculator 103 supposing that each message is quantized into a total of six bits including a sign bit. Also in FIG. 12, the variable node operation on the LDPC code represented by the check matrix H of FIG. 9 is performed. The variable node calculator 103 in FIG. 12 is supplied with a clock ck. The clock ck is supplied to necessary blocks. The blocks perform processing in synchronism with the clock ck.

According to a one-bit control signal D107, for example, supplied from the controlling unit 105, the variable node calculator 103 in FIG. 12 performs the operation (variable node operation) according to Equation (1) using messages D103 read one by one from the edge memory 102 and received data D104 (u0i) read from the receiver memory 104.

Specifically, a six-bit message D103 (check node message uj) from a check node corresponding to each row in the check matrix H is input one by one to the variable node calculator 103. The message D103 is supplied to an arithmetic unit 151 and a FIFO memory 155. In addition, in the variable node calculator 103, six-bit received data D104 (u0i) read from the receiver memory 104 on a one-by-one basis is supplied to an arithmetic unit 156. Further, the variable node calculator 103 is supplied with the control signal D107 from the controlling unit 105. The control signal D107 is supplied to a selector 153.

The arithmetic unit 151 integrates the six-bit message D103 (check node message uj) by adding the six-bit message D103 to a nine-bit value D151 stored in a register 152. The arithmetic unit 151 re-stores a resulting nine-bit integrated value in the register 152. Incidentally, when messages D103 from all edges over one column of the check matrix H are integrated, the register 152 is reset.

The arithmetic unit 151 and the register 152 integrate the six-bit message D103 a number of times that, at a maximum, corresponds to a maximum number of delays in the FIFO memory 155, that is, a maximum column weight of the check matrix H. The maximum column weight of the check matrix H in FIG. 9 is five. Hence, the arithmetic unit 151 and the register 152 integrate the six-bit message D103 five times at a maximum (perform integration for five six-bit values). Thus, in order to be able to represent a value obtained by integrating the six-bit value five times, the number of quantization bits in the output of the arithmetic unit 151 and subsequent outputs is nine, which is larger by three (a minimum number of bits that can represent five [times]) than that of the six-bit message D103.

When the messages D103 over one column of the check matrix H are read one by one, and an integrated value obtained by integrating the message D103 for one column is stored in the register 152, the control signal D107 supplied from the controlling unit 105 is changed from zero to one. For example, in a case where the column weight of the check matrix is "5", the control signal D107 is "0" for a first to a fourth clock, and is "1" for a fifth clock.

When the control signal D107 is "1", the selector 153 selects the value stored in the register 152, that is, the nine-bit value D151 (Σuj from j=1 to dV) obtained by integrating the messages D103 (check node messages uj) from all the edges over one column of the check matrix H, and then outputs the value D151 to a register 154 to store the value D151 in the register 154. The register 154 supplies the value D151 stored therein as a nine-bit value D152 to the selector 153 and the arithmetic unit 156. When the control signal D107 is "0", the selector 153 selects the value D152 supplied from the register 154, and then outputs the value D152 to the register 154 to re-store the value D152 in the register 154. That is, until the messages D103 (check node messages uj) from all the edges over one column of the check matrix H are integrated, the register 154 supplies a previously integrated value to the selector 153 and the arithmetic unit 156.

Meanwhile, the FIFO memory 155 delays the message D103 from the check node until the new value D152 ($\Sigma uj$ from j=1 to dV) is output from the register 154, and then supplies the message D103 as a six-bit value D153 to the arithmetic unit 156. The arithmetic unit 156 subtracts the value D153 supplied from the FIFO memory 155 from the value D152 supplied from the register 154. That is, the arithmetic unit 156 subtracts a check node message uj from an edge for which a variable node message vi is desired to be obtained from the integrated value of the messages D103 (check node messages uj) from all the edges over one column of the check matrix H. The arithmetic unit 156 thereby obtains the subtraction value ($\Sigma uj$ from j=1 to dV−1). Further, the arithmetic unit 156 adds the subtraction value ($\Sigma uj$ from j=1 to dV−1) to the received data D104 (u0i) supplied from the receiver memory 104. The arithmetic unit 156 supplies a resulting six-bit value as a message D105 (variable node message vi).

As described above, the variable node calculator 103 performs the operations of Equation (1), and thereby obtains the variable node message vi.

Incidentally, since the maximum column weight of the check matrix H of FIG. 9 is five, that is, since the maximum number of check node messages uj supplied to the variable node is five, the variable node calculator 103 has the FIFO memory 155 for delaying five check node messages uj. When a variable node message vi for a column with a column weight of less than five is to be calculated, an amount of delay in the FIFO memory 155 is reduced to the value of the column weight.

The arithmetic unit 156 performs the operations of subtracting the six-bit value D153 supplied from the FIFO memory 155 from the nine-bit value D152 supplied from the register 154, and adding the value obtained by the subtraction to the six-bit received data D104 supplied from the receiver memory 104. A result of the operations may be less than a minimum value that can be represented by the six-bit message D105, or may exceed a maximum value that can be represented by the six-bit message D105. When the operation result is less than the minimum value that can be represented by the six-bit message D105, the arithmetic unit 156 clips the operation result to the minimum value. When the operation result exceeds the maximum value that can be represented by the six-bit message D105, the arithmetic unit 156 clips the operation result to the maximum value.

In the decoding device of FIG. 10, the control signals are supplied from the controlling unit 105 according to the weights of the check matrix H. The decoding device of FIG. 10 can decode the LDPC codes of various check matrices H by changing only the control signals as long as the edge memories 100 and 102 and the FIFO memories 127, 133, and 155 in the check node calculator 101 and the variable node calculator 103 have sufficient capacities.

Though not shown in the figures, the decoding device of FIG. 10 performs the operation of Equation (5) in place of the variable node operation of Equation (1) in a final decoding stage, and outputs a result of the operation as a final decoding result.

When an LDPC code is decoded by using the decoding device of FIG. 10 repeatedly, the check node operation and the variable node operation are performed alternately. Specifically, in the decoding device of FIG. 10, the variable node calculator 103 performs the variable node operation using a result of the check node operation by the check node calculator 101, and the check node calculator 101 performs the check node operation using a result of the variable node operation by the variable node calculator 103.

Incidentally, while FIG. 10 shows a full serial decoding device that decodes an LDPC code by sequentially performing operations at nodes one by one as an example of implementation of a decoding device, other decoding devices have been proposed in C. Howland and A. Blanksby, "Parallel Decoding Architectures for Low Density Parity Check Codes", Symposium on Circuits and Systems, 2001 [Non-Patent Literature 1] and E. Yeo, P. Pakzad, B. Nikolic, and V. Anantharam, "VLSI Architectures for Iterative Decoders in Magnetic Recording Channels", IEEE Transactions on Magnetics, Vol. 37, No. 2, March 2001 [Non-Patent Literature 2]. The Non-Patent Literature 1 is a full parallel decoding device that performs decoding by performing operations at all nodes simultaneously. The Non-Patent Literature 2 is a partly parallel decoding device that simultaneously performs operations at a certain number of nodes rather than one node or all nodes.

For example, in the decoding device of FIG. 10, the number of bits at least equal to a value obtained by multiplying the code length of the LDPC code by the number of bits of quantization values representing the received data D104 (the number of quantization bits) is required as a storage capacity of the receiver memory 104 for storing the received data D104. The number of bits at least equal to a value obtained by multiplying a total number of edges by the number of bits of quantization values representing messages is required as storage capacities of the edge memories 100 and 102 for storing the messages.

Hence, when the code length is 108, the number of bits of the quantization values representing the messages (including the received data D104) is six, and the number of edges is 323, as described above, the receiver memory 104 having a storage capacity of at least 648 (=108×6) bits and the edge memories 100 and 102 having a storage capacity of at least 1938 (=323× 6) bits are required.

Incidentally, in this case, the code length is 108 for simplicity of the description; in practice, however, a few thousand is used as the code length of an LDPC code.

On the other hand, when considered simply, to improve accuracy of decoding of an LDPC code requires quantization values of a certain number of bits as the quantization values representing the messages (including the received data D104).

However, as described above, the storage capacities of the edge memories 100 and 102 and the receiver memory 104 are proportional to the number of bits of the quantization values representing the messages. Therefore, when the messages are represented by a quantization value of a large number of bits, high-capacity memories are required as memories forming the decoding device, thus increasing the scale of the device.

SUMMARY OF THE INVENTION

The present invention has been made in view of such a situation. It is desirable to be able to decode an LDPC code with a high precision while preventing an increase in scale of the device.

According to an embodiment of the present invention, a decoding device/decoding method includes: a first converting unit/first converting step for converting a first quantization value assigned to a numerical value into a second quantization value representing a numerical value with a higher precision than the first quantization value; and a second converting unit/second converting step for converting the second quantization value into the first quantization value. In processing performed as a check node operation and a variable node operation for decoding an LDPC code, a first operation unit and a second operation unit use the second quantization value in processing from after the operation of a nonlinear function to the operation of an inverse function, and use the first quantization value in the other processing.

In the present invention, the first quantization value is converted into the second quantization value, while the second quantization value is converted into the first quantization value. The second quantization value representing a numerical value with a higher precision than the first quantization value is used in the processing from after the operation of the nonlinear function to the operation of the inverse function in the processing performed as the check node operation and the variable node operation for decoding the LDPC code, and the first quantization value is used in the other processing.

According to the present invention, it is possible to decode an LDPC code with a high precision while preventing an increase in scale of the device.

BRIEF DESCRIPTION OF THE DRAWINGS

FIG. 1 is a diagram of assistance in explaining the check matrix of an LDPC code;

FIG. 2 is a diagram showing a check matrix with a parity part forming a lower triangular matrix;

FIG. 3 is a flowchart of assistance in explaining a procedure for decoding an LDPC code;

FIG. 9 is a diagram showing an example of the check matrix of an LDPC code;

FIG. 21 is a diagram showing BER/FER.

DETAILED DESCRIPTION OF THE PREFERRED EMBODIMENTS

Figures 4, 5:
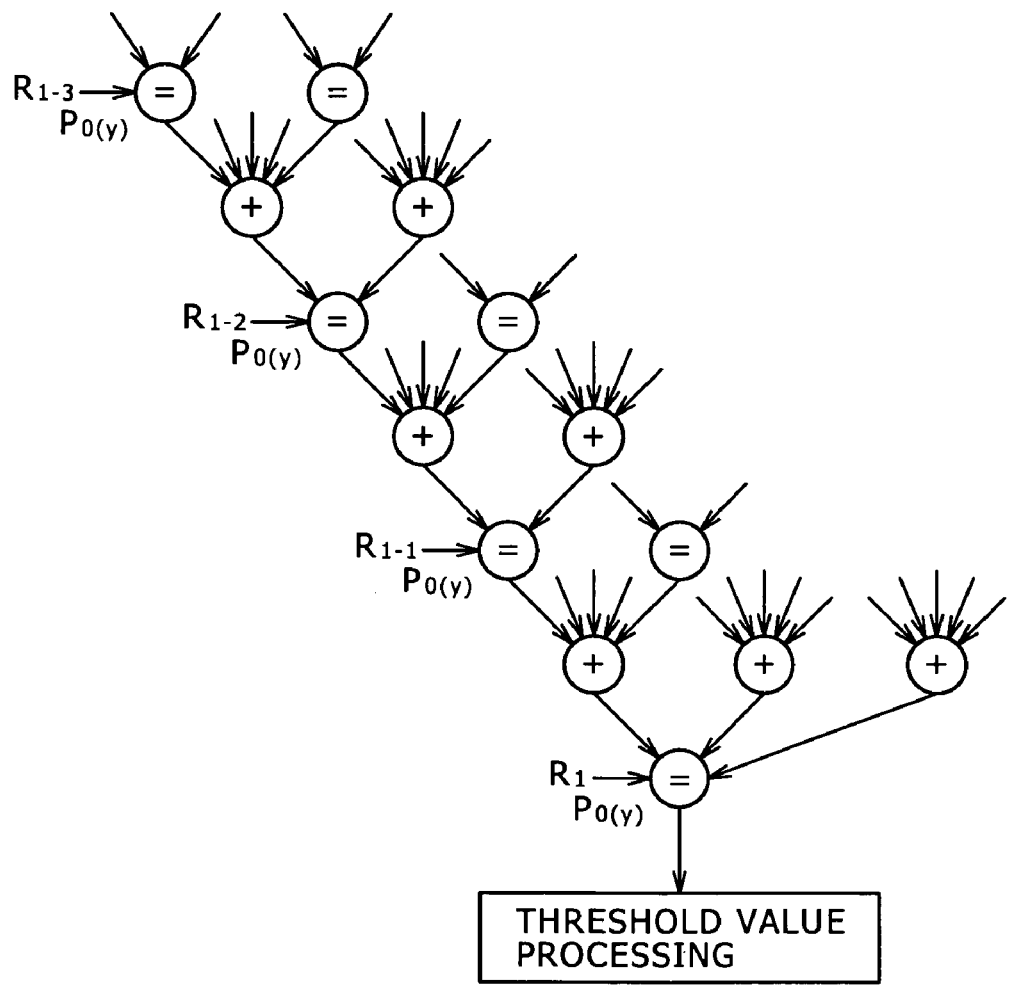
FIG. 4 is a diagram of assistance in explaining a flow of messages.
FIG. 5 is a diagram showing an example of the check matrix of an LDPC code.
Figure 6:
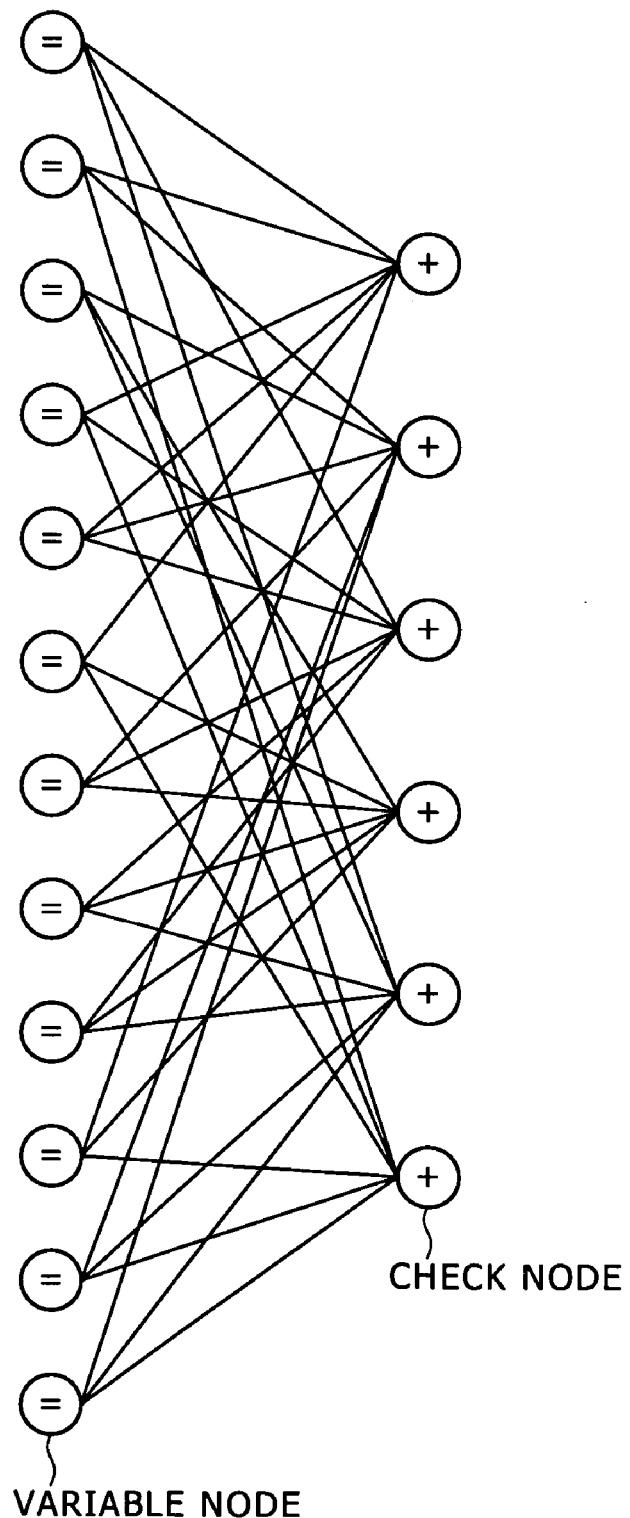
FIG. 6 is a diagram showing a Tanner graph of the check matrix.
Figure 7:
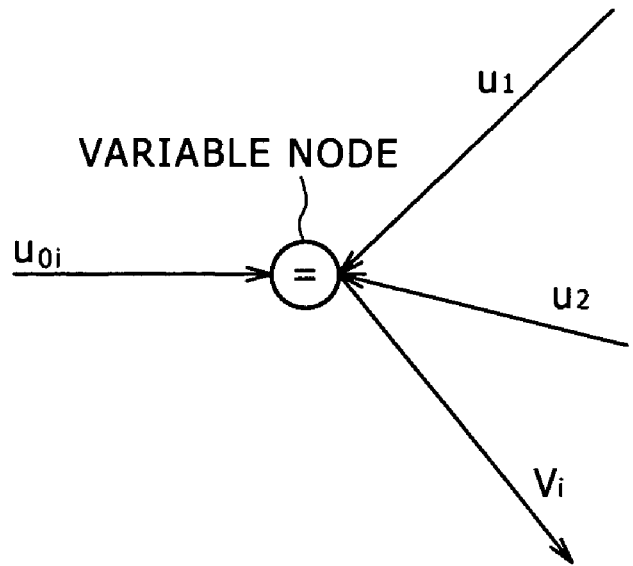
FIG. 7 is a diagram showing a variable node.
Figure 8:
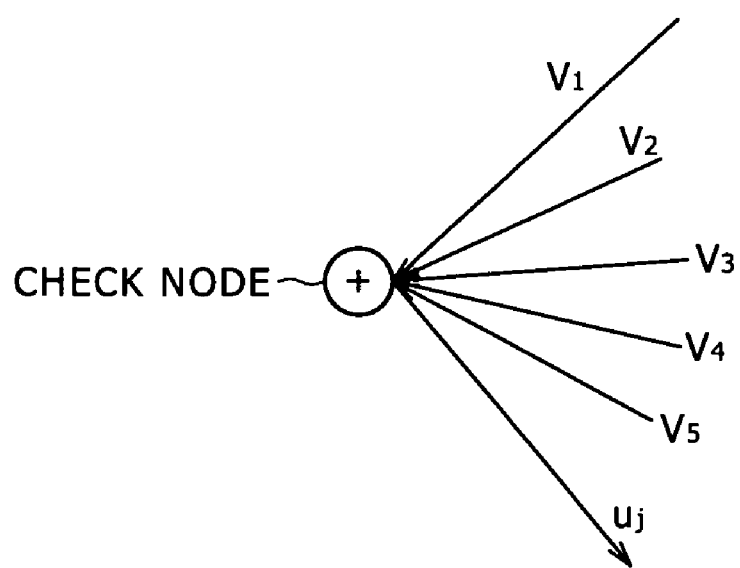
FIG. 8 is a diagram showing a check node.

Preferred embodiments of the present invention will hereinafter be described. Correspondences between required elements described in claims and concrete examples in the embodiments of the invention are illustrated as follows. This description is to confirm that the concrete examples supporting inventions described in the claims are described in the embodiments of the invention. Therefore, even when there is a concrete example described in the embodiments of the invention but not described here as corresponding to a required element, it does not signify that the concrete example does not correspond to the required element. Conversely, even when a concrete example is described here as corresponding to a required element, it does not signify that the concrete example does not correspond to required elements other than that required element.

Further, this description does not signify that inventions corresponding to the concrete examples described in the embodiments of the invention are all described in the claims. In other words, this description does not negate presence of inventions corresponding to concrete examples described in the embodiments of the invention but not described in the claims of the present application, that is, presence of inventions for divisional application or to be added by amendments in the future.

A decoding device according to an embodiment of the present invention is a decoding device (for example a decoding device in FIG. 13 or FIG. 17) for decoding an LDPC (Low Density Parity Check) code. The decoding device includes a first operation unit (for example a check node calculator 171 in FIG. 13 or a quasi check node calculator 412 in FIG. 17) for performing a check node operation at a check node for decoding the LDPC code, the check node operation including an operation of a nonlinear function (for example $\phi(x)$) and an operation of an inverse function (for example $\phi^{-1}(x)$) of the nonlinear function; and a second operation unit (for example a variable node calculator 103 in FIG. 13 or a quasi variable node calculator 415 in FIG. 17) for performing a variable node operation at a variable node for decoding the LDPC code. The first operation unit includes a first converting unit (for example a LUT 1121 in FIG. 14 or a LUT 432 in FIG. 19) for converting a first quantization value assigned to a numerical value into a second quantization value representing a numerical value with a higher precision than the first quantization value, and a second converting unit (for example a LUT 1128 in FIG. 14 or a LUT 439 in FIG. 19) for converting the second quantization value into the first quantization value. In processing performed as the check node operation and the variable node operation, the first operation unit and the second operation unit use the second quantization value in processing from after the operation of the nonlinear function to the operation of the inverse function, and use the first quantization value in the other processing.

A decoding method according to an embodiment of the present invention is a decoding method of a decoding device (for example a decoding device in FIG. 13 or FIG. 17) for decoding an LDPC (Low Density Parity Check) code, the decoding device including a first operation unit (for example a check node calculator 171 in FIG. 13 or a quasi check node calculator 412 in FIG. 17) for performing a check node operation at a check node for decoding the LDPC code, the check node operation including an operation of a nonlinear function (for example $\phi(x)$) and an operation of an inverse function (for example $\phi^{-1}(x)$) of the nonlinear function, and a second operation unit (for example a variable node calculator 103 in FIG. 13 or a quasi variable node calculator 415 in FIG. 17) for performing a variable node operation at a variable node for decoding the LDPC code. The decoding method includes a first converting step (for example step S1 in FIG. 15) for converting a first quantization value assigned to a numerical value into a second quantization value representing a numerical value with a higher precision than the first quantization value, and a second converting step (for example step S5 in FIG. 15) for converting the second quantization value into the first quantization value. In processing performed as the check node operation and the variable node operation, the first operation unit and the second operation unit use the second quantization value in processing from after the operation of the nonlinear function to the operation of the inverse function, and use the first quantization value in the other processing.

Preferred embodiments of the present invention will hereinafter be described with reference to the drawings.

Figure 13:
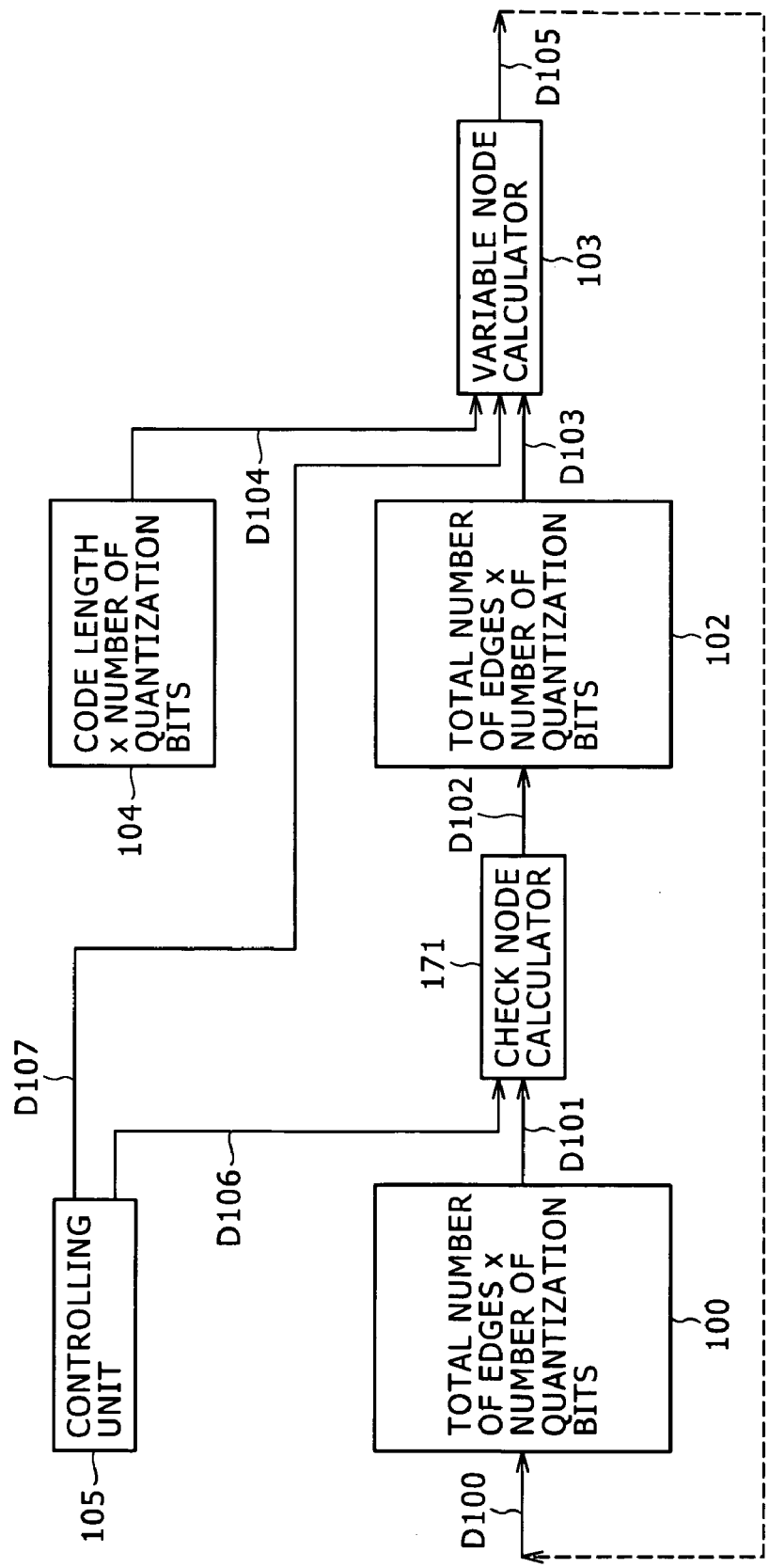
FIG. 13 is a block diagram showing a first example of configuration of a decoding device according to an embodiment of the present invention.

FIG. 13 shows a first example of configuration of a decoding device for decoding an LDPC code according to an embodiment of the present invention. Incidentally, in FIG. 13, parts corresponding to those of the decoding device in FIG. 10 are identified by the same reference numerals, and description thereof will be omitted in the following as appropriate.

Figure 10:
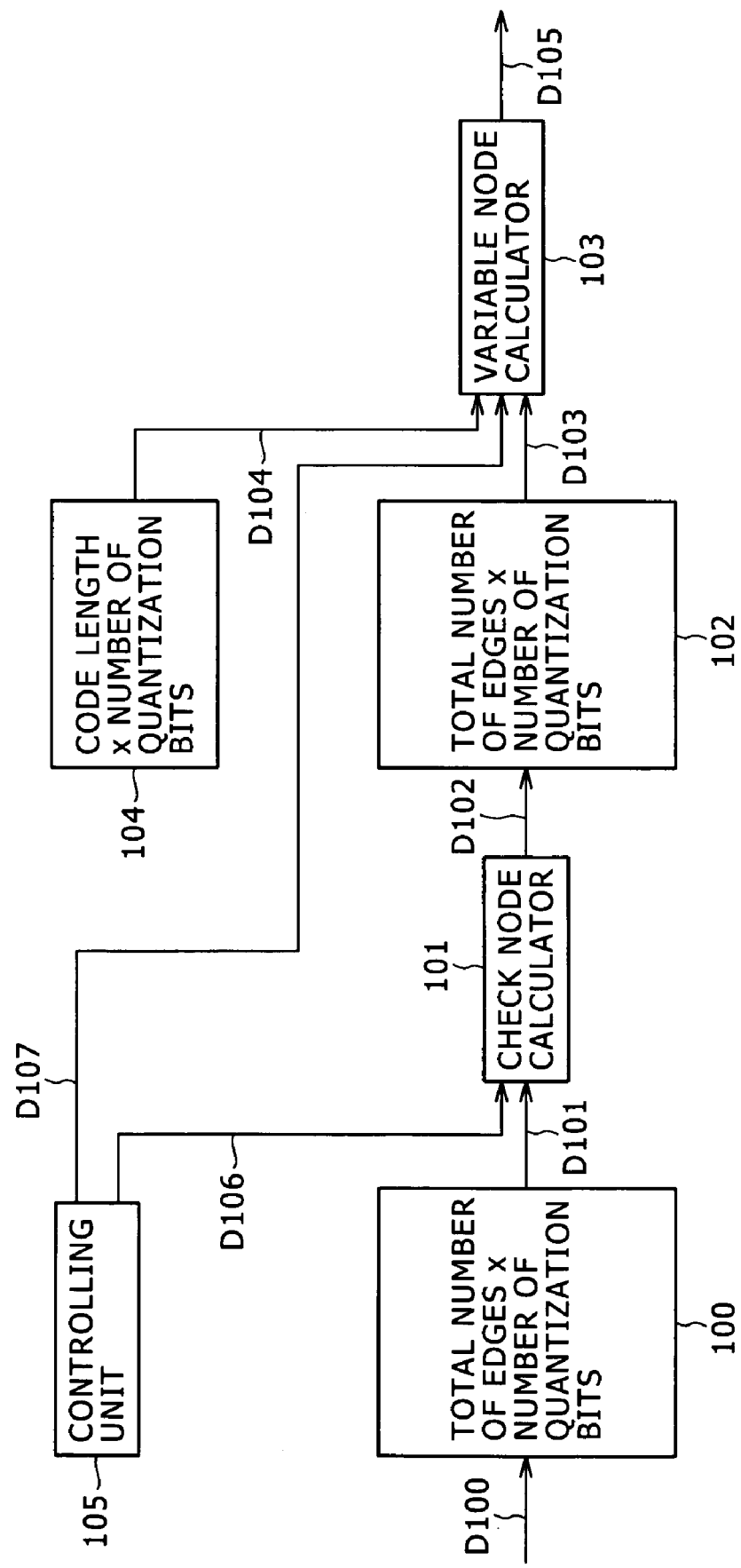
FIG. 10 is a block diagram showing an example of configuration of an LDPC code decoding device that performs node operations one by one.

The decoding device in FIG. 13 is similar to the decoding device in FIG. 10 in that the decoding device in FIG. 13 includes edge memories 100 and 102, a variable node calculator 103, a receiver memory 104, and a controlling unit 105. However, the decoding device in FIG. 13 is different from the decoding device in FIG. 10 in that the decoding device in FIG. 13 has a check node calculator 171 in place of the check node calculator 101.

Figure 9:
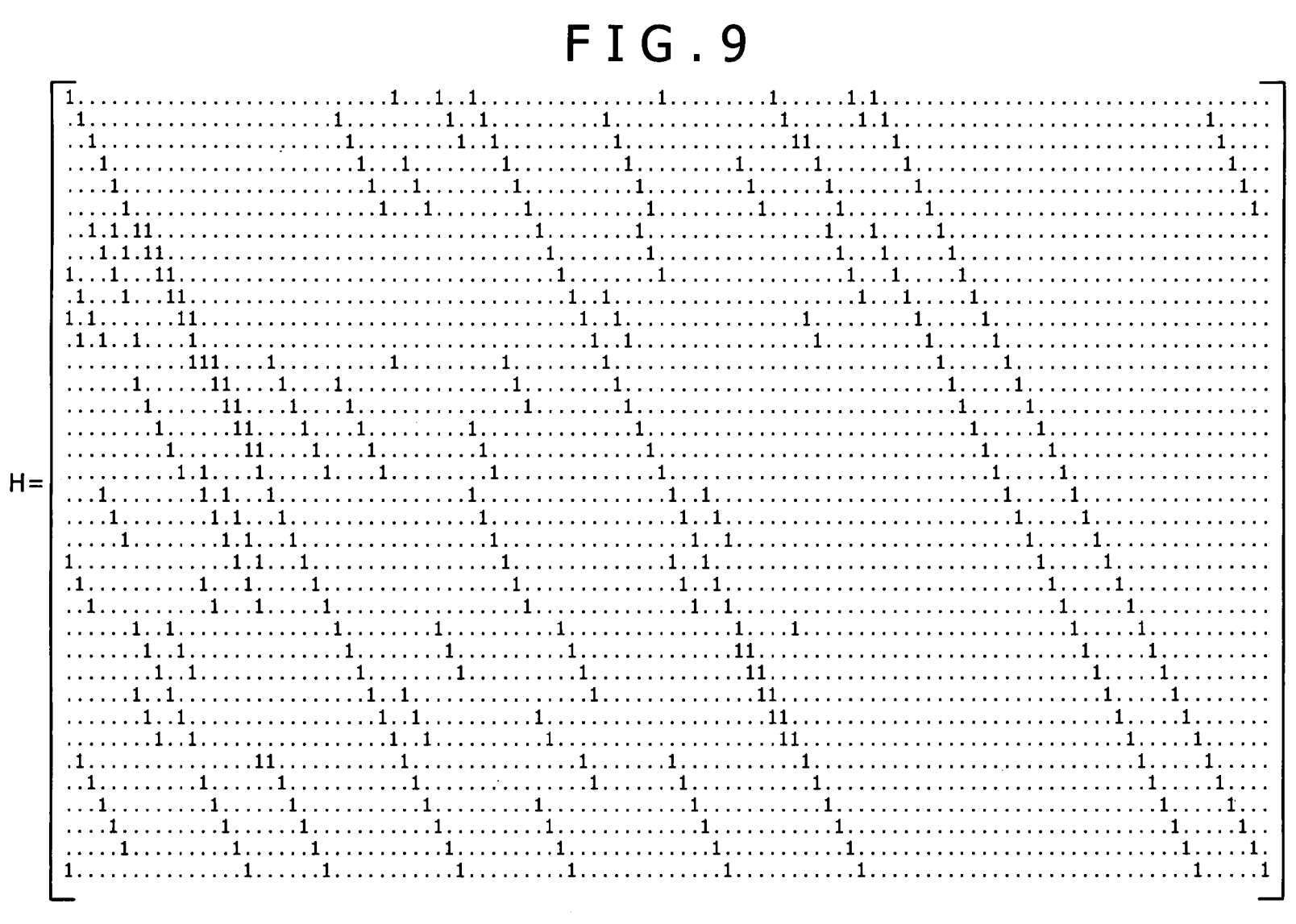

Suppose in this case that the decoding device in FIG. 13 decodes an LDPC code (an encoding rate of 2/3 and a code length of 108) represented by a check matrix H shown in FIG. 9 described above, for example. The same is true for a decoding device in FIG. 17 to be described later.

In the decoding device in FIG. 13, the check node calculator 171 performs a check node operation, and the variable node calculator 103 performs a variable node operation. The check node operation and the variable node operation are performed alternately, whereby the LDPC code is decoded.

Specifically, the receiver memory 104 is sequentially supplied with received data $u_{0i}$ of the LDPC code in units of the code length (108 in this case, as mentioned above), and stores the received data $u_{0i}$.

Then, the variable node calculator 103 performs a variable node operation at a variable node for decoding the LDPC code.

Specifically, the edge memory 102 stores a message D102 (check node message $u_j$) as a result of a check node operation by the check node calculator 171 to be described later. The edge memory 102 supplies the message D102 as a message D103 to the variable node calculator 103. Further, the variable node calculator 103 is supplied with a control signal D107 from the controlling unit 105, and supplied with received data D104 from the receiver memory 104.

Figure 12:
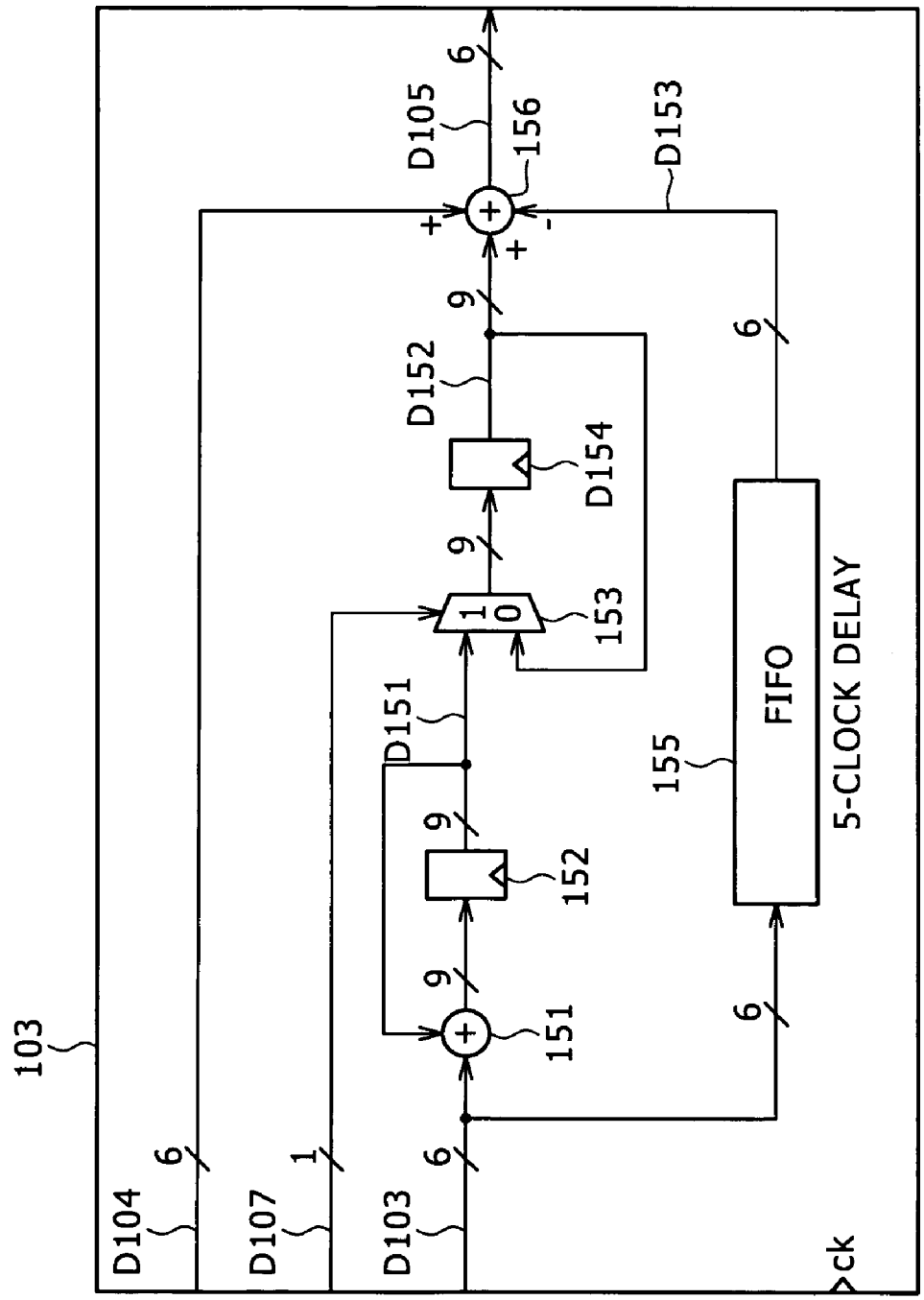
FIG. 12 is a block diagram showing an example of configuration of a variable node calculator that calculates messages one by one.

The variable node calculator 103 is configured as shown in FIG. 12 described above. According to the control signal D107, the variable node calculator 103 performs a variable node operation according to Equation (1) using the message D103 (check node message $u_j$) supplied from the edge memory 102 and the received data D104 ($u_{0i}$) supplied from the receiver memory 104. The variable node calculator 103 supplies a message D105 (variable node message $v_i$) obtained as a result of the variable node operation to the edge memory 100 as a message D100.

The edge memory 100 stores the message D100 (variable node message $v_i$) obtained as a result of the variable node operation, which message is supplied from the variable node calculator 103. The edge memory 100 then reads the message D100 as a message D101, and supplies the message D101 to the check node calculator 171.

The check node calculator 171 performs a check node operation at a check node for decoding the LDPC code. The check node operation includes an operation of a nonlinear function and an operation of an inverse function of the nonlinear function.

Specifically, according to a control signal D106 supplied from the controlling unit 105, the check node calculator 171 performs a check node operation according to Equation (7) including an operation of a nonlinear function $\phi(x)$ and an operation of an inverse function $\phi^{-1}(x)$ of the nonlinear function $\phi(x)$ using the message D101 (variable node message $v_i$) supplied from the edge memory 100. The check node calculator 171 supplies a message D102 (check node message $u_j$) obtained by the check node operation to the edge memory 102 in a following stage.

The edge memory 102 stores the message D102 supplied from the check node calculator 171 in a preceding stage. Then, the message D102 stored in the edge memory 102 is read as the message D103, and supplied to the variable node calculator 103, as described above.

The decoding device in FIG. 13 repeats the variable node operation and the check node operation a predetermined number of times, for example, for the received data $u_{0i}$ of the code length which data is stored in the receiver memory 104. At a last time, the decoding device performs an operation of Equation (5) in place of the variable node operation of Equation (1). The decoding device outputs a result of the operation as a final result of decoding the received data $u_{0i}$ (LDPC code) of the code length which data is stored in the receiver memory 104.

The decoding device in FIG. 13 is similar to the decoding device in FIG. 10 described above in that the decoding device in FIG. 13 decodes the LDPC code by repeatedly performing the check node operation and the variable node operation.

However, the decoding device in FIG. 13 uses a quantization value (second quantization value) representing a numerical value with a higher precision than the same quantization value (first quantization value) as used by the decoding device in FIG. 10 in processing from after the operation of the nonlinear function $\phi(x)$ to the operation of the inverse function $\phi^{-1}(x)$ in processing performed as the check node operation and the variable node operation. The decoding device in FIG. 13 uses the same quantization value as used by the decoding device in FIG. 10 in the other processing.

In the decoding device in FIG. 10, as described above, a message (and also received data $u_{0i}$) is represented by a six-bit quantization value assigned to each numerical value for uniformly dividing a predetermined numerical range into 64 values that can be represented by six bits including a sign bit. Specifically, in a case of a predetermined numerical range of $-R/2$ to $+R/2$ ($R>0$), six-bit quantization values representing a message are assigned to 64 numerical values from $-R/2$ to $+R/2-R/64$ at intervals of $R/64$ as a quantization width, and represent the respective numerical values. The six-bit quantization value representing a message will be referred to as a normal quantization value.

The quantization value representing a numerical value with a higher precision than the normal quantization value, used in the processing from after the operation of the nonlinear function ϕ(x) to the operation of the inverse function ϕ$^{-1}$(x) in the decoding device of FIG. 13, will be referred to as a high-precision quantization value.

Since high-precision quantization values represent numerical values with a higher precision than normal quantization values, high-precision quantization values have a smaller quantization width, that is, a smaller difference (an absolute value thereof) between a numerical value assigned to a certain quantization value and a numerical value assigned to a quantization value smaller than the certain quantization value by one than normal quantization values.

Hence, when the number of bits of a high-precision quantization value is made equal to the number of bits (six bits in this case) of a normal quantization value, a numerical range that can be represented by the high-precision quantization value is narrower than a numerical range that can be represented by the normal quantization value. That is, a difference (dynamic range) between a maximum value and a minimum value that can be represented by the high-precision quantization value is narrower than a difference (dynamic range) between a maximum value and a minimum value that can be represented by the normal quantization value.

Supposing that the dynamic range which can be represented by the high-precision quantization value when the number of bits of the high-precision quantization value is made equal to the number of bits of the normal quantization value is denoted by Dy1 and the quantization width of such a high-precision quantization value is denoted by Qd1, when a numerical range Dy2 wider than the dynamic range Dy1 is to be represented by the high-precision quantization value while the quantization width of the high-precision quantization value remains Qd1, or when the numerical range of the dynamic range Dy1 is to be represented by the high-precision quantization value with the quantization width of the high-precision quantization value set at Qd2, which is smaller than Qd1, for example, the number of bits of the high-precision quantization value needs to be larger than the number of bits of the normal quantization value.

Quantization values representing numerical values with a higher precision than the normal quantization value, that is, quantization values having a smaller quantization width than the normal quantization value can be used as the high-precision quantization value regardless of the dynamic range and the number of bits. In this case, however, a quantization value having a smaller quantization width than the normal quantization value, providing a wider dynamic range than the normal quantization value, and having a larger number of bits than the normal quantization value is used as the high-precision quantization value.

Supposing that the number of bits of the high-precision quantization value is 10 bits including a sign bit, for example, which are more than six bits of the normal quantization value, the decoding device in FIG. 13 uses the 10-bit high-precision quantization value (second quantization value) in processing from after the operation of the nonlinear function ϕ(x) to the operation of the inverse function ϕ$^{-1}$(x) (which processing will hereinafter be referred to as processing between the nonlinear function operations as appropriate), and uses the six-bit quantization value (first quantization value) in the other processing.

Since the processing between the nonlinear function operations using the 10-bit high-precision quantization value is processing for a part of the check node operation, the six-bit normal quantization value is used for the messages stored in the edge memories 100 and 102 and the received data u$_{0i}$ stored in the receiver memory 104.

Hence, a storage capacity necessary for the edge memories 100 and 102 and the receiver memory 104 in the decoding device of FIG. 13 is the same as in the decoding device of FIG. 10.

Figure 14:
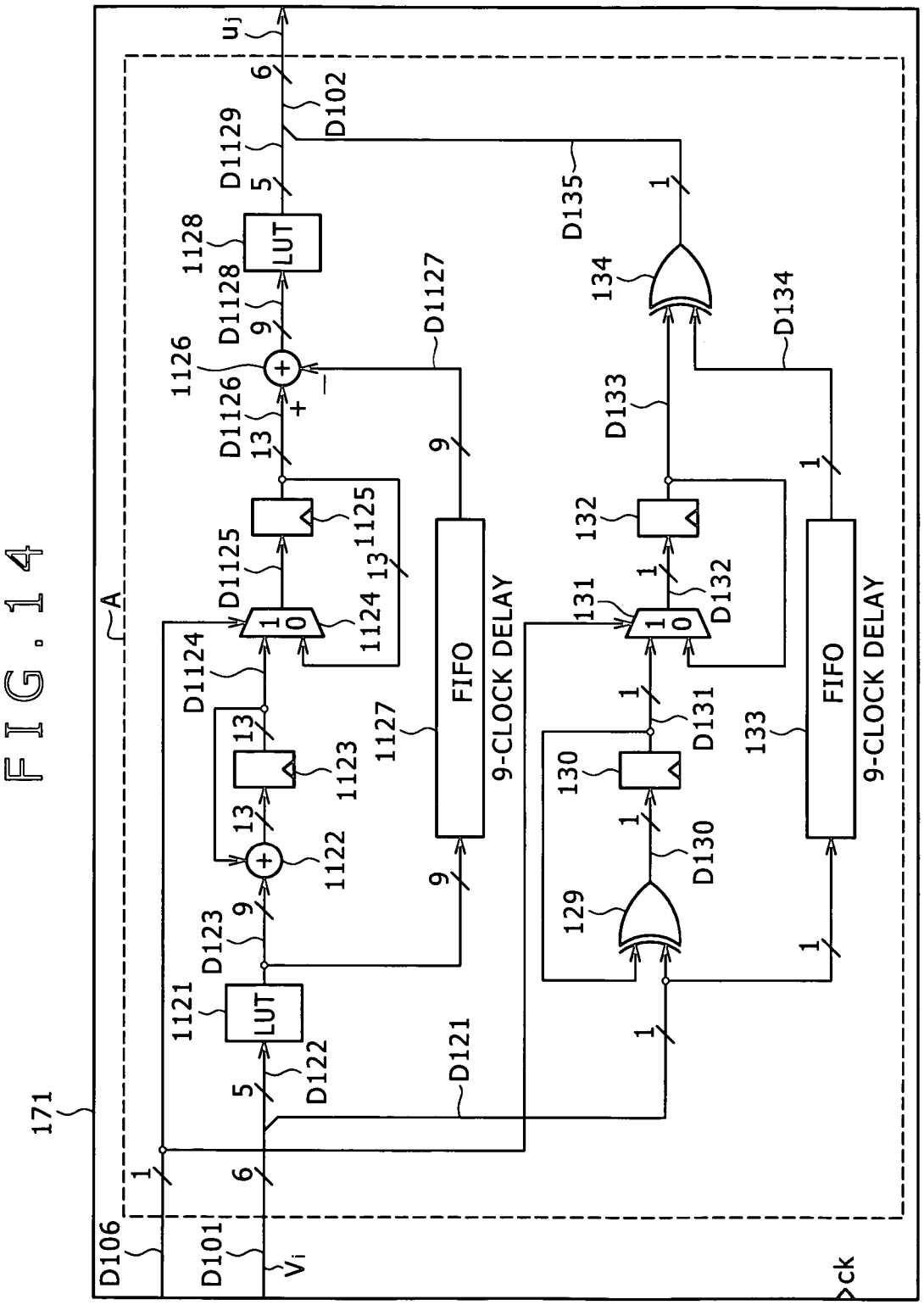
FIG. 14 is a block diagram showing an example of configuration of a check node calculator.

FIG. 14 shows an example of configuration of the check node calculator 171 in FIG. 13. Incidentally, in FIG. 14, parts corresponding to those of the check node calculator 101 in FIG. 11 are identified by the same reference numerals, and description thereof will be omitted in the following as appropriate.

Figure 11:
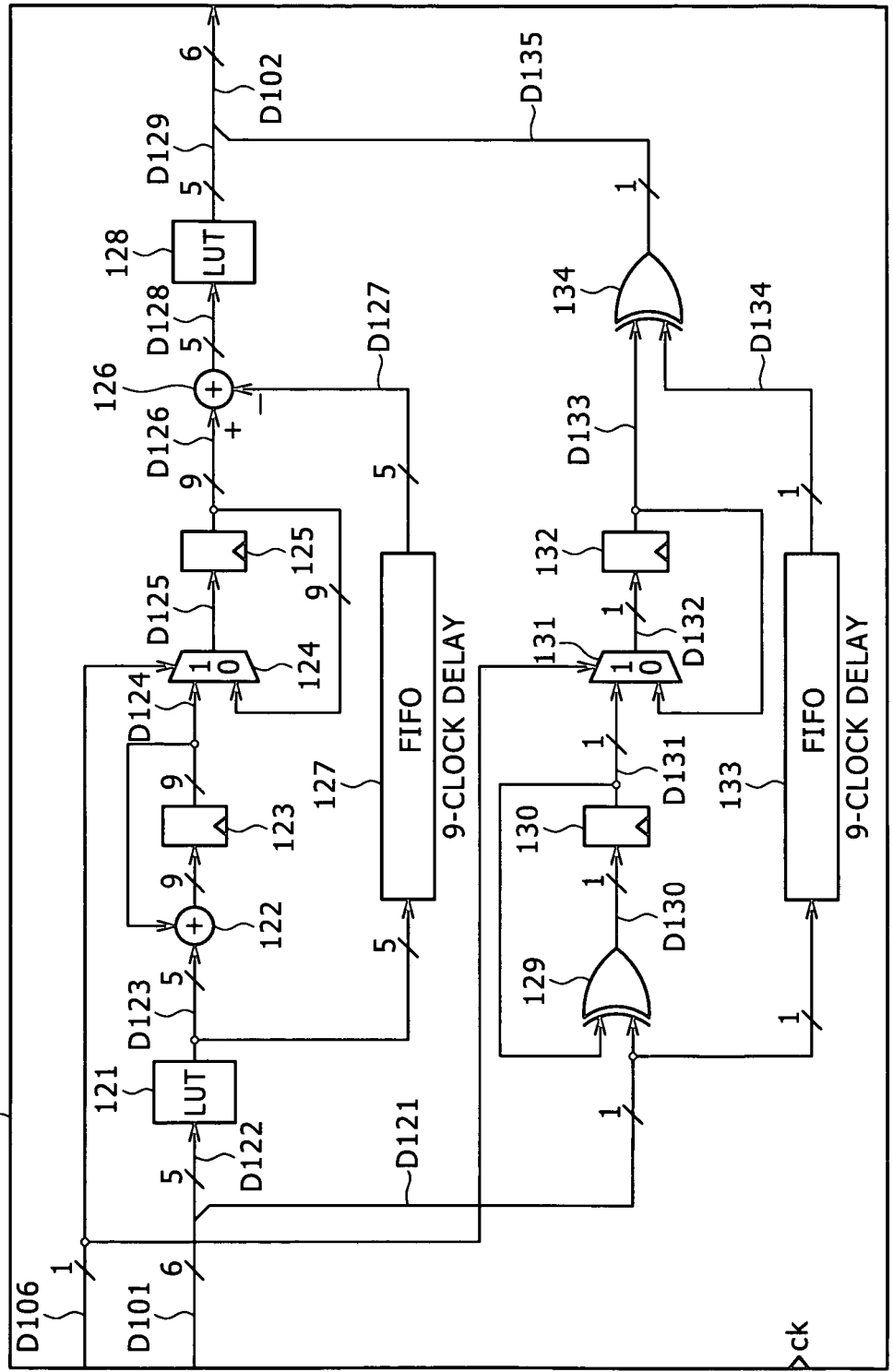
FIG. 11 is a block diagram showing an example of configuration of a check node calculator that calculates messages one by one.

The check node calculator 171 is different from the check node calculator 101 in FIG. 11 in that the check node calculator 171 includes a LUT 1121, an arithmetic unit 1122, a register 1123, a selector 1124, a register 1125, an arithmetic unit 1126, a FIFO memory 1127, and a LUT 1128 in place of the LUT 121, the arithmetic unit 122, the register 123, the selector 124, the register 125, the arithmetic unit 126, the FIFO memory 127, and the LUT 128, respectively, in FIG. 11, and in that the number of bits of parts indicated by a thick line in FIG. 14 is increased by four bits, which is a difference between the number of bits of the high-precision quantization value and the number of bits of the normal quantization value.

As with the check node calculator 101 in FIG. 11, according to a one-bit control signal D106, for example, supplied from the controlling unit 105, the check node calculator 171 in FIG. 14 performs a check node operation according to Equation (7) using messages D101 (variable node messages $v_i$) read one by one from the edge memory 100.

Figure 15:
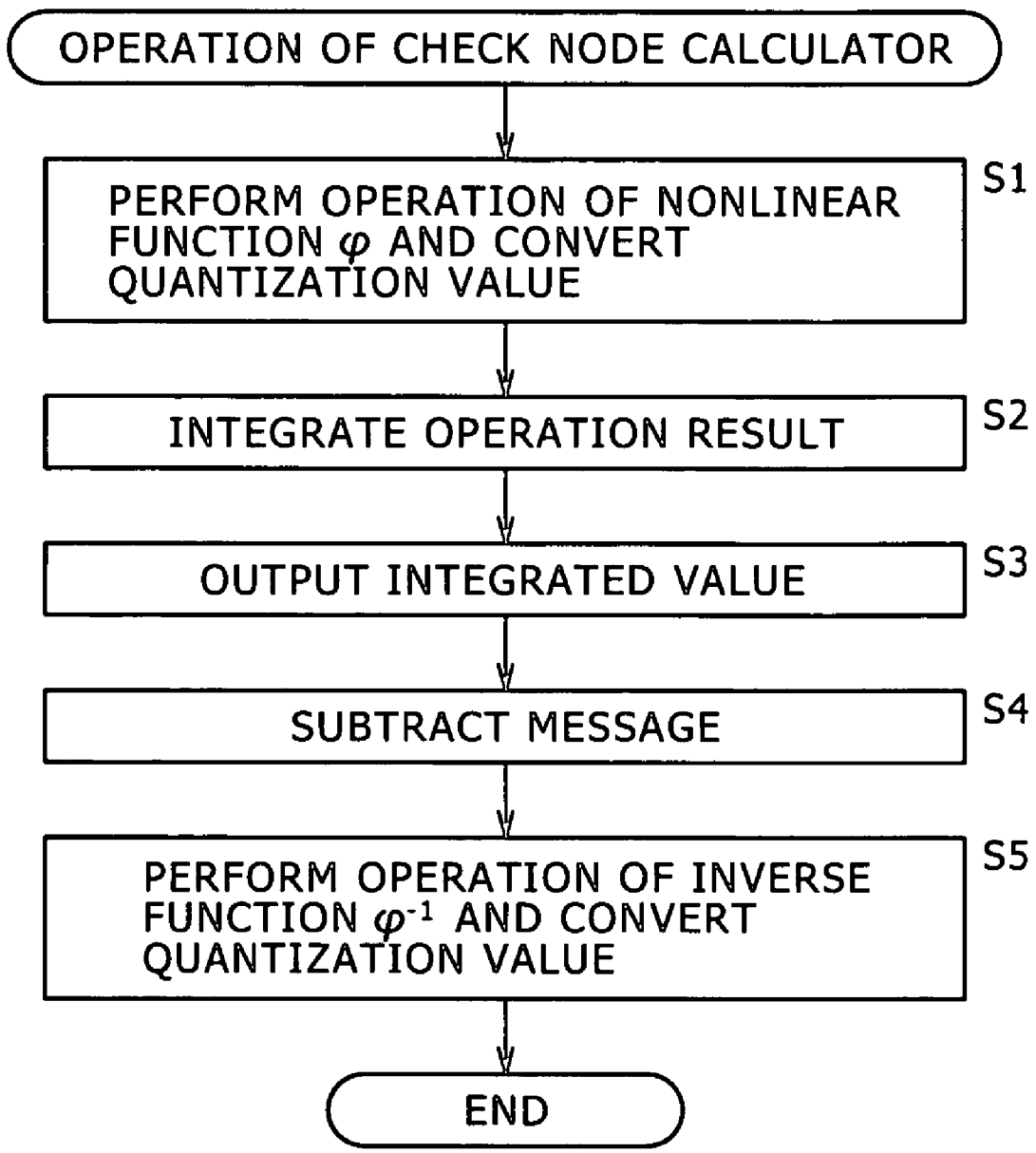
FIG. 15 is a flowchart of assistance in explaining the processing of the check node calculator.

FIG. 15 represents processing performed in the check node calculator 171.

A six-bit message D101 (variable node message $v_i$) from a variable node corresponding to each column in a check matrix H is input one by one to the check node calculator 171. An absolute value D122 (|$v_i$|), which is five less significant bits of the message D101, is supplied to the LUT 1121, and a sign bit D121, which is the most significant bit of the message D101, is supplied to an EXOR circuit 129 and a FIFO (First In First Out) memory 133. The check node calculator 171 is also supplied with the control signal D106 from the controlling unit 105. The control signal D106 is supplied to a selector 1124 and a selector 131.

The LUT 1121 stores a result D1123 (ϕ(|$v_i$|)) of the operation of the nonlinear function ϕ(|$v_i$|) in Equation (7) in association with the five-bit absolute value D122 (|$v_i$|). In the LUT 1121, the absolute value D122 (|$v_i$|) is represented by a normal quantization value, whereas the result D1123 (ϕ(|$v_i$|)) of the operation of the nonlinear function ϕ(|$v_i$|) is represented by a high-precision quantization value. That is, the LUT 1121 stores for example the nine-bit result D1123 (ϕ(|$v_i$|)) of the operation of the nonlinear function ϕ(|$v_i$|) which result is represented by the high-precision quantization value in association with the five-bit absolute value D122 (|$v_i$|) represented by the normal quantization value.

The LUT 1121 in step S1 reads the nine-bit result D1123 (ϕ(|$v_i$|)) of the operation of the nonlinear function ϕ(|$v_i$|) which result is represented by the high-precision quantization value and associated with the five-bit absolute value D122 (|$v_i$|) as an input which value is represented by the normal quantization value. The LUT 1121 outputs the nine-bit result D1123 (ϕ(|$v_i$|)) of the operation of the nonlinear function ϕ(|$v_i$|) to the arithmetic unit 1122 and the FIFO memory 1127.

Thus, the LUT 1121 in step S1 equivalently performs processing for calculating the nonlinear function ϕ(x) in Equation (7) and processing for converting the normal quantization value to the high-precision quantization value. Thereafter processing is performed using the high-precision quantization value until the LUT 1128 to be described later converts the high-precision quantization value to the normal quantization value.

Then, in step S2, the arithmetic unit 1122 integrates the nine-bit result D1123 ($\phi(|v_i|)$) by adding the operation result D1123 to a 13-bit value D1124 stored in the register 1123. The arithmetic unit 1122 re-stores a resulting 13-bit integrated value in the register 1123. Incidentally, when results of operation on the absolute values D122 ($|v_i|$) of messages D101 from all edges over one row of the check matrix H are integrated, the register 1123 is reset.

The arithmetic unit 1122 and the register 1123 integrate the nine-bit operation result D1123 ($\phi(|v_i|)$) supplied from the LUT 1121 a number of times that, at a maximum, corresponds to a maximum number of delays in the FIFO memory 1127, that is, a maximum row weight of the check matrix H. The maximum row weight of the check matrix H in FIG. 9 is nine. Hence, the arithmetic unit 1122 and the register 1123 integrate the nine-bit high-precision quantization value nine times at a maximum (perform integration for nine nine-bit high-precision quantization values). Thus, in order to be able to represent a value obtained by integrating the nine-bit high-precision quantization value nine times, the number of bits of the high-precision quantization value in the output of the arithmetic unit 1122 and subsequent outputs is 13, which is larger by four (a minimum number of bits that can represent nine (times)) than that of the nine-bit operation result D1123 ($\phi(|v_i|)$) output by the LUT 1121.

When the messages D101 (variable node messages $v_i$) over one row of the check matrix H are read one by one, and an integrated value obtained by integrating operation results D1123 for one row is stored in the register 1123, the control signal D106 supplied from the controlling unit 105 is changed from zero to one. For example, in a case where the row weight of the check matrix H is "9", the control signal D106 is "0" for a first to an eighth clock, and is "1" for a ninth clock.

When the control signal D106 is "1", the selector 1124 in step S3 selects the value stored in the register 1123, that is, the 13-bit integrated value D1124 ($\Sigma\phi(|v_i|)$ from i=1 to i=dc) obtained by integrating $\phi(|v_i|)$ obtained from the messages D101 (variable node messages $v_i$) from all the edges over one row of the check matrix H, and then outputs the value as a 13-bit value D1125 to the register 1125 to store the value D1125 in the register 1125. The register 1125 supplies the value D1125 stored therein as a 13-bit value D1126 to the selector 1124 and the arithmetic unit 1126. When the control signal D106 is "0", the selector 1124 selects the value D1126 supplied from the register 1125, and then outputs the value D1126 to the register 1125 to re-store the value D1126 in the register 1125. That is, until $\phi(|v_i|)$ obtained from the messages D101 (variable node messages $v_i$) from all the edges over one row of the check matrix H is integrated, the register 1125 supplies previously integrated $\phi(|v_i|)$ to the selector 1124 and the arithmetic unit 1126.

Meanwhile, the FIFO memory 1127 delays the nine-bit operation result D1123 ($\phi(|v_i|)$) output by the LUT 1121 until the new value D1126 ($\Sigma\phi(|v_i|)$ from i=1 to i=dc) is output from the register 1125, and then supplies the nine-bit operation result D1123 ($\phi(|v_i|)$) as a nine-bit value D1127 to the arithmetic unit 1126. The arithmetic unit 1126 in step S4 subtracts the nine-bit value D1127 supplied from the FIFO memory 1127 from the 13-bit value D1126 supplied from the register 1125. The arithmetic unit 1126 supplies a result of the subtraction as a nine-bit subtraction value D1128 to the LUT 1128. That is, the arithmetic unit 1126 subtracts $\phi(|v_i|)$ obtained from a message D101 (variable node message $v_i$) from an edge for which a check node message $u_j$ is desired to be obtained from the integrated value of $\phi(|v_i|)$ obtained from the messages D101 (variable node messages $v_i$) from all the edges over one row of the check matrix H. The arithmetic unit 1126 supplies the subtraction value ($\Sigma\phi(|v_i|)$ from i=1 to i=dc−1) as the subtraction value D1128 to the LUT 1128.

Incidentally, when a quantization value (high-precision quantization value) as the result of the subtraction of the nine-bit value D1127 supplied from the FIFO memory 1127 from the 13-bit value D1126 supplied from the register 1125 exceeds a maximum value that can be represented by the nine-bit subtraction value D1128, the arithmetic unit 1126 clips the high-precision quantization value as the result of the subtraction to the maximum value that can be represented by the nine-bit high-precision quantization value, and then outputs the nine-bit subtraction value D1128.

The LUT 1128 stores an operation result D1129 ($\phi^{-1}(\Sigma\phi(|v_i|))$) obtained by performing the operation of the inverse function $\phi^{-1}(\Sigma\phi(|v_i|))$ in Equation (7) in association with the subtraction value D1128 ($\Sigma\phi(|v_i|)$ from i=1 to i=dc−1). In the LUT 1128, the subtraction value D1128 ($\Sigma\phi(|v_i|)$ from i=1 to i=dc−1) is represented by a high-precision quantization value, whereas the operation result D1129 ($\phi^{-1}(\Sigma\phi(|v_i|))$) obtained by performing the operation of the inverse function $\phi^{-1}(\Sigma\phi(|v_i|))$ is represented by a normal quantization value. That is, the LUT 1128 stores the five-bit operation result D1129 ($\phi^{-1}(\Sigma\phi(|v_i|))$) obtained by performing the operation of the inverse function $\phi^{-1}(\Sigma\phi(|v_i|))$, the operation result D1129 being represented by the normal quantization value, in association with the nine-bit subtraction value D1128 ($\Sigma\phi(|v_i|)$ from i=1 to i=dc−1) represented by the normal quantization value.

The LUT 1128 in step S5 reads the five-bit operation result D1129 ($\phi^{-1}(\Sigma\phi(|v_i|))$) of the operation of the inverse function $\phi^{-1}(\Sigma\phi(|v_i|))$, the operation result D1129 being represented by the normal quantization value, in association with the nine-bit subtraction value D1128 ($\Sigma\phi(|v_i|)$ from i=1 to i=dc−1) represented by the normal quantization value as an input, and then outputs the five-bit operation result D1129 ($\phi^{-1}(\Sigma\phi(|v_i|))$).

Thus, the LUT 1128 in step S5 equivalently performs processing for calculating the inverse function $\phi^{-1}(\Sigma\phi(|v_i|))$ in Equation (7) and processing for converting the high-precision quantization value to the normal quantization value. Thereafter processing is performed using the normal quantization value until the LUT 1121 described above converts the normal quantization value to the high-precision quantization value.

In parallel with the above processing, an EXOR circuit 129, a register 130, a selector 131, a register 132, a FIFO memory 133, and an EXOR circuit 134 perform the same processing as in the check node calculator 101 in FIG. 11. Thus, the EXOR circuit 134 divides a multiplied value obtained by multiplying together the sign bits D121 (sign ($|v_i|$)) of the messages D101 (variable node messages $v_i$) from all the edges over one row of the check matrix H by the sign bit D121 (sign($|v_i|$)) of a message D101 from an edge for which the check node message $u_j$ is desired to be obtained. The EXOR circuit 134 outputs the divided value ($\Pi$sign($|v_i|$) from i=1 to i=dc−1) as a divided value D135.

The check node calculator 171 then outputs a message D102 (check node message $u_j$) represented by a normal quantization value of a total of six bits with the five-bit operation result D1129 output from the LUT 1128 and represented by the normal quantization value as less significant five-bit and the one-bit divided value D135 output from the EXOR circuit 134 as a most significant bit (sign bit).

Thus, the check node calculator 171 converts the normal quantization value to the high-precision quantization value in the LUT 1121, and converts the high-precision quantization value to the normal quantization value in the LUT 1128. The check node calculator 171 thereby uses the high-precision quantization value in processing from after the operation of the nonlinear function $\phi(x)$ to the operation of the inverse function $\phi^{-1}(x)$ of the nonlinear function $\phi(x)$ in processing performed as the check node operation and the variable node operation, and uses the normal quantization value in the other processing. It is therefore possible to decode the LDPC code with a high precision while preventing an increase in scale of the decoding device.

Figure 16:
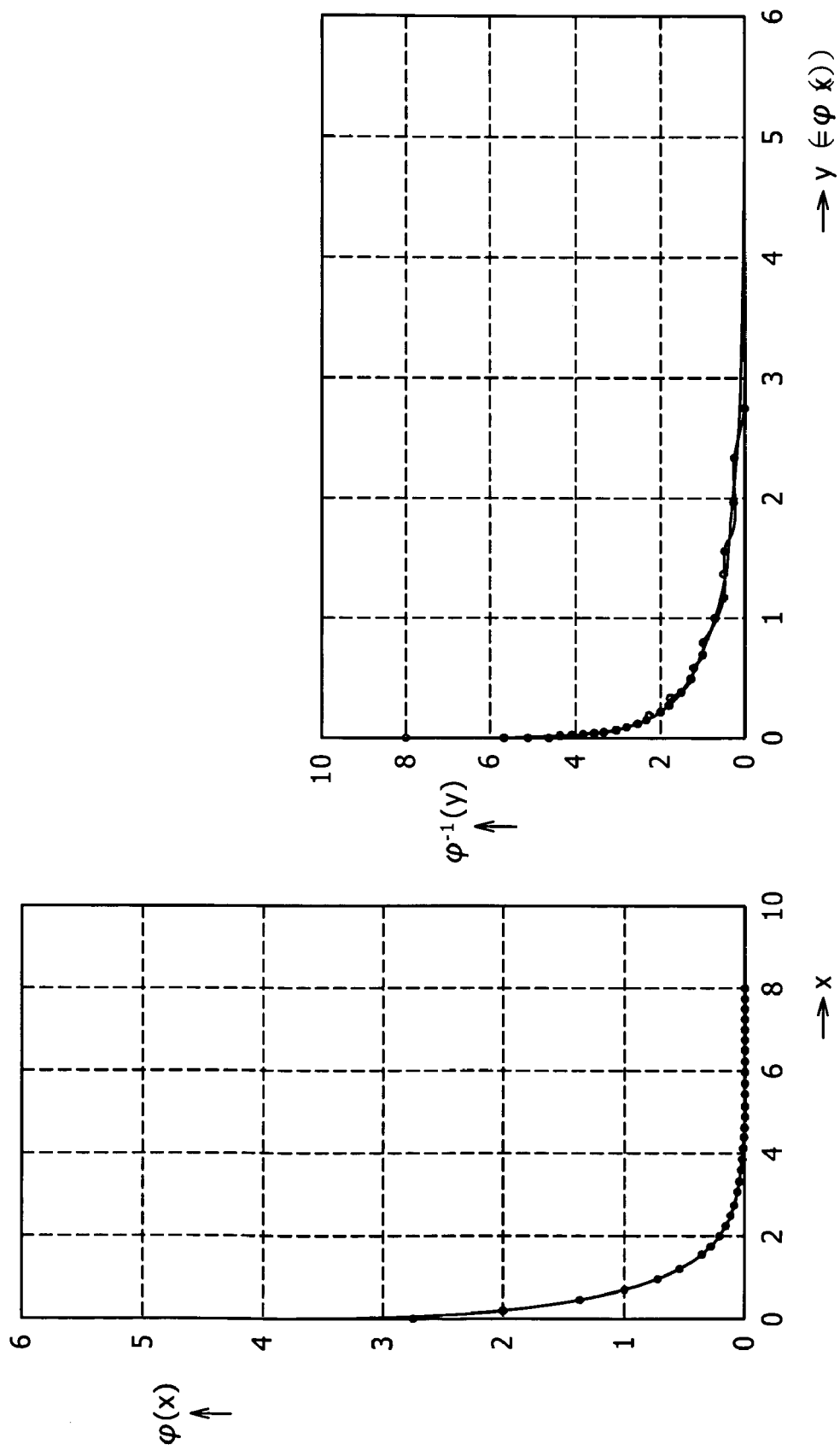
FIG. 16 is a diagram showing a nonlinear function $\phi(x)$ and an inverse function of the nonlinear function.

FIG. 16 shows the nonlinear function $\phi(x)$ and the inverse function $\phi^{-1}(y)$ of the nonlinear function $\phi(x)$ Incidentally, circle marks in FIG. 16 represent a numerical value that can be assumed by a result of operation of the nonlinear function $\phi(x)$ and an argument x thereof and a numerical value that can be assumed by the inverse function $\phi^{-1}(x)$ and an argument y thereof when the normal quantization value is used.

A left side of FIG. 16 shows the nonlinear function $\phi(x)$. A right side of FIG. 16 shows the inverse function $\phi^{-1}(y)$ of the nonlinear function $\phi(x)$.

The nonlinear function $\phi(x)$ shown on the left side of FIG. 16 becomes substantially zero when the argument x becomes greater than a certain large numerical value.

On the other hand, the inverse function $\phi^{-1}(y)$ shown on the right side of FIG. 16 changes sharply when the argument y is around a numerical value of zero.

Therefore operation precision is degraded when processing after the operation of the nonlinear function $\phi(x)$ to the operation of the inverse function $\phi^{-1}(x)$ of the nonlinear function $\phi(x)$ in the operation of Equation (7) as the check node operation is performed using the normal quantization value.

That is, when a result of operation of the nonlinear function $\phi(x)$ is represented by a normal quantization value, normal quantization values representing an identical numerical value of zero are obtained as all results of operation of the nonlinear function $\phi(x)$ for the argument x greater than a certain large numerical value. That is, the results of operation of the nonlinear function $\phi(x)$ for the argument x greater than the certain large numerical value are substantially zero, and are therefore difficult to represent with a high precision by the normal quantization value.

The integrated value ($\Sigma\phi(|v_i|)$ from i=1 to i=dc−1) of the nonlinear function $\phi(|v_i|)$ in the check node operation of Equation (7) is the argument y of the inverse function $\phi^{-1}(y)$. As described above, normal quantization values indicating the results of operation of the nonlinear function $\phi(|v_i|)$ for the argument $v_i$ greater than the certain large numerical value all represent the numerical value of zero.

Hence, when normal quantization values representing the numerical value of zero are obtained as all results of operation of the nonlinear function $\phi(|v_i|)$ to be integrated, the integrated value ($\Sigma\phi(|v_i|)$ from i=1 to i=dc−1) is also a normal quantization value representing the numerical value of zero. Thus, the normal quantization value representing the numerical value of zero is given as the argument y of the inverse function $\phi^{-1}(y)$.

Since the inverse function $\phi^{-1}(y)$ changes sharply when the argument y is around the numerical value of zero, in order to obtain a high-precision operation result as a result of operation of the inverse function $\phi^{-1}(y)$, it is desirable to represent the argument y by particularly a quantization value representing numerical values around zero with a high precision.

However, as described above, when the normal quantization value is used, normal quantization values representing the numerical value of zero are obtained as all results of operation of the nonlinear function $\phi(|v_i|)$ for an argument $|v_i|$ greater than a certain large numerical value. As a result, a normal quantization value representing the integrated value $\Sigma\phi(|v_i|)$ as the argument of the inverse function $\phi^{-1}(\Sigma\phi(|v_i|))$ also indicates the numerical value of zero.

Thus, when the integrated value $\Sigma\phi(|v_i|)$ is around the numerical value of zero and the integrated value $\Sigma\phi(|v_i|)$ is slightly changed, a result of operation of the inverse function $\phi^{-1}(\Sigma\phi(|v_i|))$ should properly differ greatly. However, since integrated values $\Sigma\phi(|v_i|)$ around zero are all represented by normal quantization values indicating the numerical value of zero, an identical operation result is obtained as a result of operation of the inverse function $\phi^{-1}(\Sigma\phi(|v_i|))$ for the slightly changed integrated value $\Sigma\phi(|v_i|)$, that is, an operation result with a large error is obtained.

On the other hand, when processing from after the operation of the nonlinear function $\phi(x)$ to the operation of the inverse function $\phi^{-1}(x)$ of the nonlinear function $\phi(x)$ is performed using the high-precision quantization value, a high-precision quantization value representing a numerical value around zero with a high precision is obtained as a result of operation of the nonlinear function $\phi(x)$ even for the argument x greater than a certain large numerical value. As a result, even when the integrated value $\Sigma\phi(|v_i|)$ as the argument of the inverse function $\phi^{-1}(\Sigma\phi(|v_i|))$ is a numerical value around zero, a high-precision quantization value representing the numerical value with a high precision is obtained.

Hence, even when the integrated value $\Sigma\phi(|v_i|)$ is a value around the numerical value of zero, a high-precision result of operation of the inverse function $\phi^{-1}(\Sigma\phi(|v_i|))$ (a high-precision quantization value indicating the result of operation of the inverse function $\phi^{-1}(\Sigma\phi(|v_i|))$) is obtained, which result varies according to each slight change in the integrated value $\Sigma\phi(|v_i|)$. As a result, the LDPC code can be decoded with a high precision.

Further, since the high-precision quantization value is used in processing from after the operation of the nonlinear function $\phi(|v_i|)$ to the operation of the inverse function $\phi^{-1}(\Sigma\phi(|v_i|))$ of the nonlinear function $\phi(|v_i|)$, and the normal quantization value is used in the other processing, only the scale of a part using the high-precision quantization value in the check node calculator 171 (FIG. 14), that is, the LUT 1121 to the LUT 1128 slightly increases by an amount corresponding to a difference between the number of bits of the high-precision quantization value and the number of bits of the normal quantization value. As described above, a storage capacity necessary for the edge memories 100 and 102 and the receiver memory 104 in the decoding device of FIG. 13 is not different from that in the decoding device of FIG. 10 using the normal quantization value.

Thus, it is possible to decode the LDPC code with a high precision while preventing an increase in scale of the decoding device.

Incidentally, since the maximum row weight of the check matrix H of FIG. 9 is nine, that is, a maximum number of messages supplied to the check node is nine, the check node calculator 171 (FIG. 14) has the FIFO memory 1127 and the FIFO memory 133 for delaying nine messages ($\phi(|v_i|)$). When calculation is performed for messages from a row with a row weight of less than nine, an amount of delay in the FIFO memory 1127 and the FIFO memory 133 is reduced to the value of the row weight.

Figure 17:
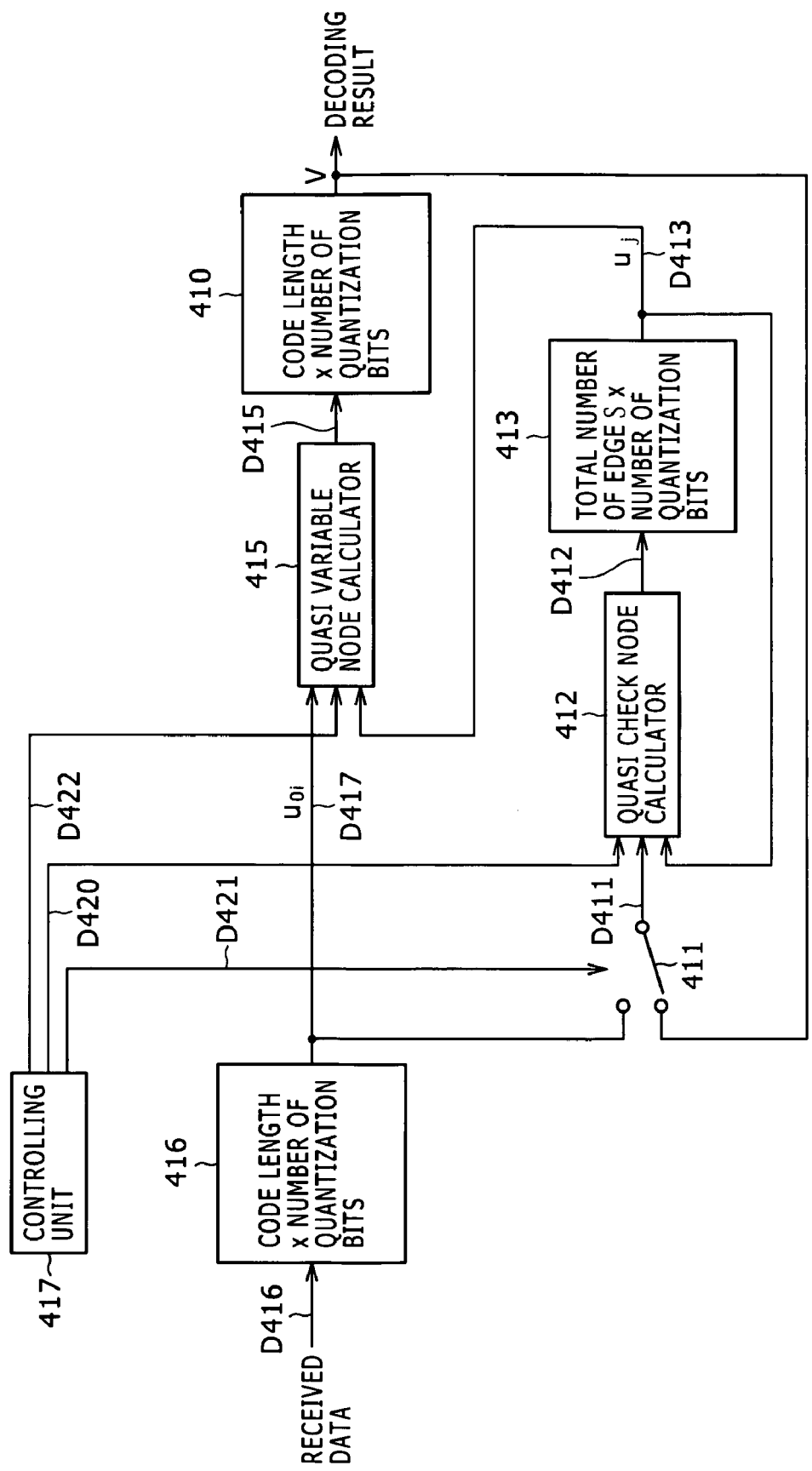
FIG. 17 is a block diagram showing a second example of configuration of a decoding device according to an embodiment of the present invention.

FIG. 17 shows a second example of configuration of a decoding device for decoding an LDPC code according to an embodiment of the present invention.

The decoding device of FIG. 17 makes it possible to decode an LDPC code with a high precision while preventing an increase in scale of the decoding device, and to reduce the storage capacity of memory necessary for the decoding device as compared with the decoding device of FIG. 13.

Incidentally, as with the above-described decoding device of FIG. 13, the decoding device of FIG. 17 for example decodes an LDPC code (an encoding rate of 2/3 and a code length of 108) represented by the check matrix H shown in FIG. 9 described above.

In FIG. 17, the decoding device includes a decoding in-progress result storing memory 410, a switch 411, a quasi check node calculator 412, an edge memory 413, a quasi variable node calculator 415, a receiver memory 416, and a controlling unit 417. The decoding device of FIG. 17 equivalently performs a check node operation and a variable node operation as in the decoding device of FIG. 13, whereby the LDPC code is decoded.

Prior to description of each part in the decoding device of FIG. 17, relation between the quasi check node calculator 412 and the quasi variable node calculator 415 in FIG. 17 and the check node calculator 171 and the variable node calculator 103 in FIG. 13 will be described with reference to FIG. 14 described above and FIGS. 18 to 20.

As described above, FIG. 14 shows an example of configuration of the check node calculator 171 in FIG. 13 which calculator performs a check node operation.

Figure 18:
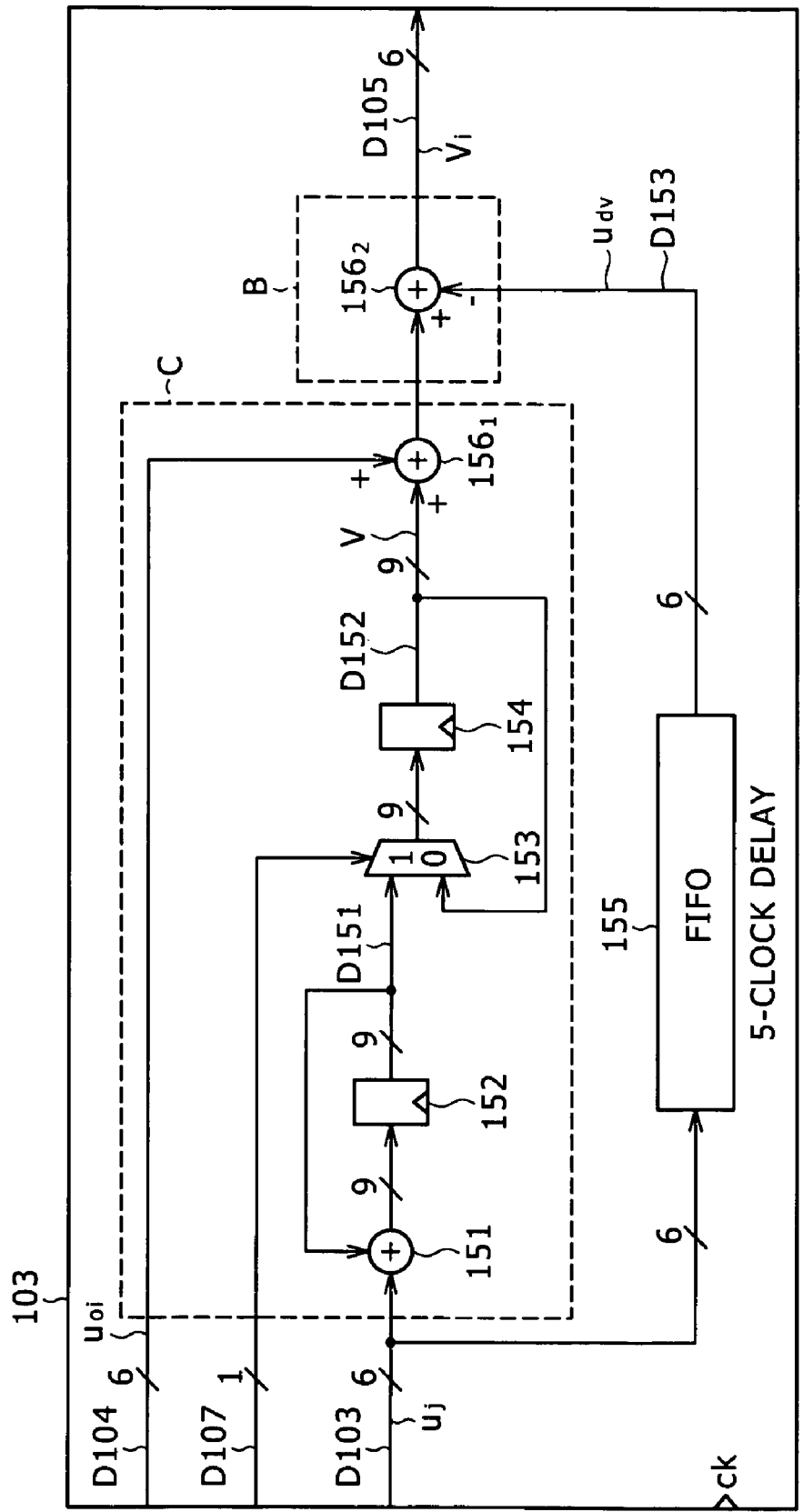
FIG. 18 is a block diagram showing an example of configuration of a variable node calculator.

FIG. 18 shows an example of configuration of the variable node calculator 103 in FIG. 13 which calculator performs a variable node operation. Incidentally, the variable node calculator 103 in FIG. 13 is identical to the variable node calculator 103 in FIG. 10. Therefore the variable node calculator 103 in FIG. 13 which calculator is shown in FIG. 18 has the same configuration as the variable node calculator 103 in FIG. 10 which calculator is shown in FIG. 12.

However, the arithmetic unit 156 in FIG. 12 is divided into two arithmetic units 1561 and 1562 shown in FIG. 18. Specifically, as described earlier, the arithmetic unit 156 in FIG. 12 subtracts the value D153 supplied from the FIFO memory 155 from the value D152 supplied from the register 154, adds a resulting subtraction value to the received data D104 supplied from the receiver memory 104, and outputs a resulting six-bit value as the message D105 (variable node message $v_i$). Therefore processing performed by the arithmetic unit 156 can be divided into subtraction processing for subtracting the value D153 supplied from the FIFO memory 155 from the value D152 supplied from the register 154 and addition processing for adding the received data D104 supplied from the receiver memory 104 to the value D152 supplied from the register 154.

Accordingly, the arithmetic unit 156 in FIG. 12 is divided into the arithmetic unit 1561 for performing the addition processing and the arithmetic unit 1562 for performing the subtraction processing, which units are shown in FIG. 18.

Figure 19:
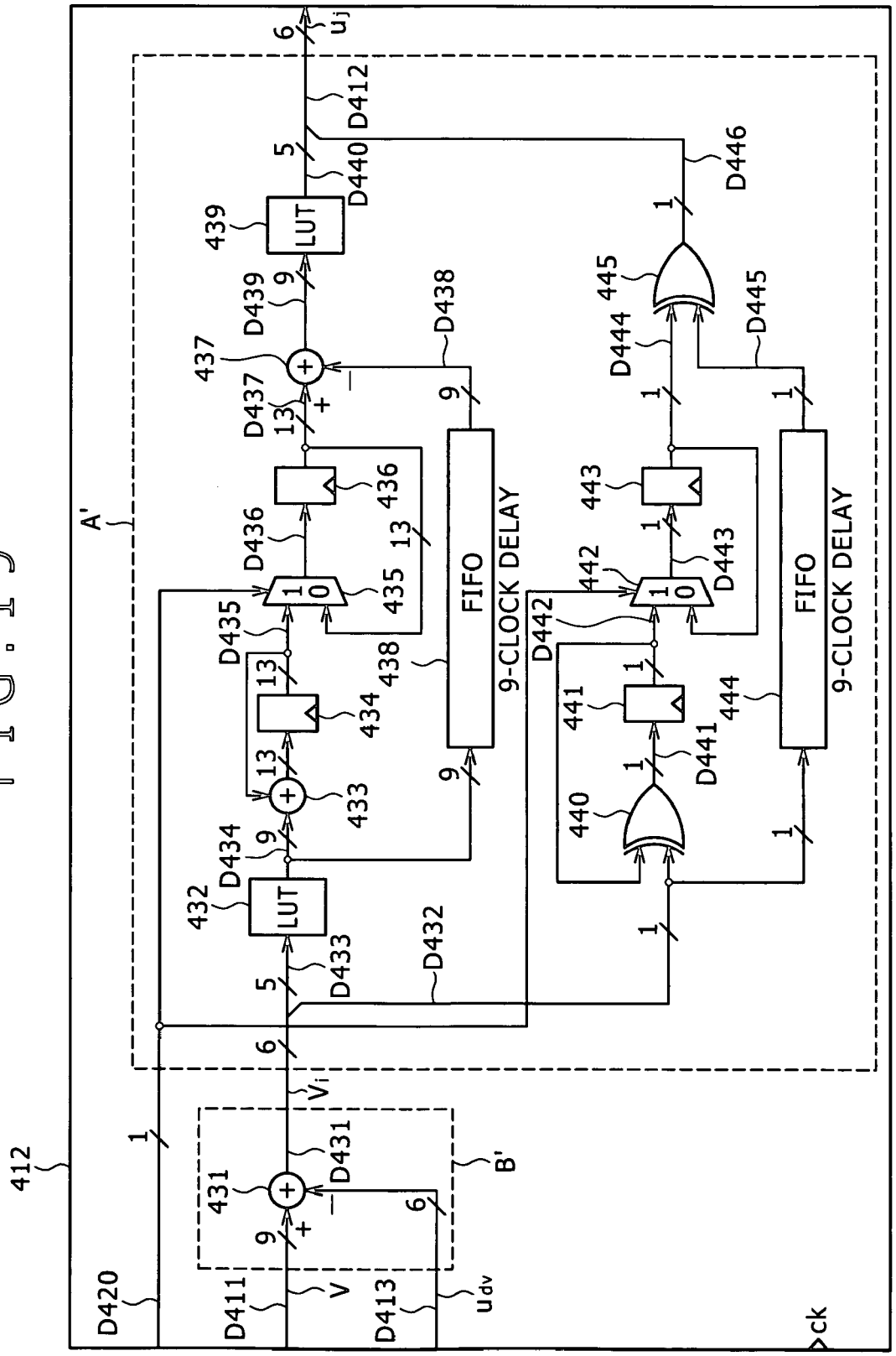
FIG. 19 is a block diagram showing an example of configuration of a quasi check node calculator.
Figure 20:
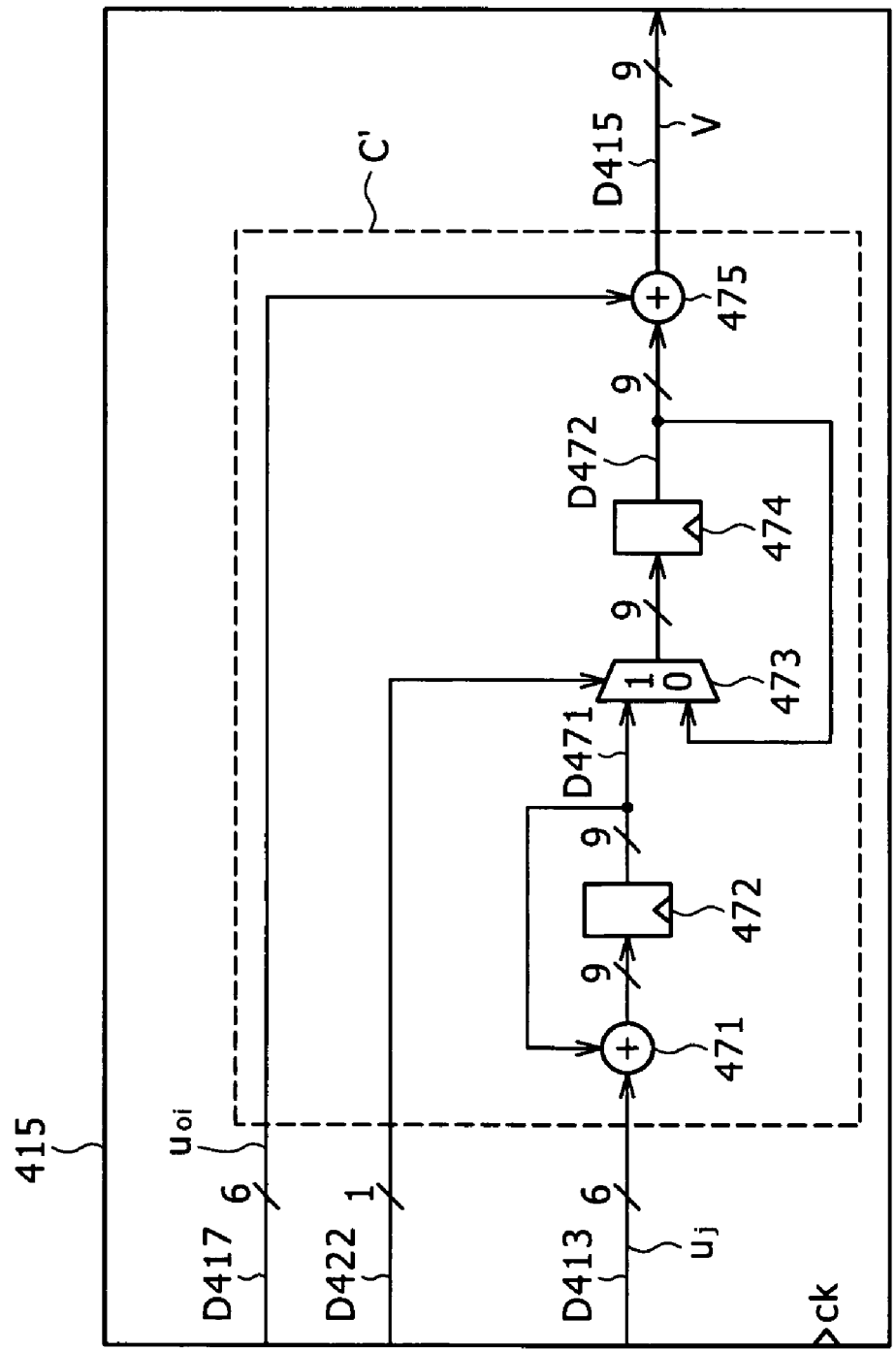
FIG. 20 is a block diagram showing an example of configuration of a quasi variable node calculator.

FIG. 19 shows an example of configuration of the quasi check node calculator 412 in FIG. 17. FIG. 20 shows an example of configuration of the quasi variable node calculator 415 in FIG. 17.

In the decoding device of FIG. 17, instead of the quasi check node calculator 412 performing the check node operation itself and the quasi variable node calculator 415 performing the variable node operation itself, the quasi check node calculator 412 performs the check node operation and a part of the variable node operation, and the quasi variable node calculator 415 performs the other part of the variable node operation.

Specifically, the quasi check node calculator 412 of FIG. 19 includes a block A' and a block B'. The block A' corresponds to a block A that performs the check node operation in the check node calculator 171 of FIG. 14. The block B' corresponds to a block B as a part of the variable node calculator 103 in FIG. 18 that subtracts a check node message $u_j$ corresponding to an edge for which a variable node message $v_i$ is desired to be obtained from the integrated value of check node messages $u_j$ corresponding to all edges in each column of the check matrix H.

On the other hand, the quasi variable node calculator 415 includes a block C'. The block C' corresponds to a block C as the other part of the variable node calculator 103 of FIG. 18 that integrates check node messages $u_j$ corresponding to edges in each column of the check matrix H, and adds received data $u_{0i}$ to a resulting integrated value.

That is, the check node calculator 171 in FIG. 13 includes the block A that performs the check node operation itself as shown in FIG. 14. As shown in FIG. 18, the variable node calculator 103 in FIG. 13 can be divided into the block B and block C. The block B performs a part of the variable node operation, that is, subtracts a check node message $u_j$ corresponding to an edge for which a variable node message $v_i$ is desired to be obtained from the integrated value of check node messages $u_j$ corresponding to all edges in each column of the check matrix H. The block C performs the other part of the variable node operation, that is, integrates the check node messages $u_j$ corresponding to the edges in each column of the check matrix H, and adds received data $u_{0i}$ to the integrated value.

The quasi check node calculator 412 of FIG. 19 includes the block A' corresponding to the block A in FIG. 14 and the block B' corresponding to the block B in FIG. 18. The quasi check node calculator 412 performs a part of the variable node operation in the block B', and performs the check node operation itself in the block A. The part of the variable node operation and the check node operation performed in the quasi check node calculator 412 will hereinafter be referred to as a quasi check node operation as appropriate.

On the other hand, the quasi variable node calculator 415 of FIG. 20 includes the block C' corresponding to the block C in FIG. 18. The quasi variable node calculator 415 performs the other part of the variable node operation in the block C'. The other part of the variable node operation performed in the quasi variable node calculator 415 will hereinafter be referred to as a quasi variable node operation as appropriate.

In the decoding device of FIG. 17, the quasi check node calculator 412 performs the quasi check node operation (part of the variable node operation and the check node operation) using contents stored in the decoding in-progress result storing memory 410 and the like. The quasi check node calculator 412 supplies a check node message $u_j$ obtained as a result of the quasi check node operation to the edge memory 413 to store the check node message $u_j$ in the edge memory 413. Further, the quasi variable node calculator 415 performs the quasi variable node operation (the other part of the variable node operation) using the check node message $u_j$ stored in the edge memory 413 and the like. The quasi variable node calculator 415 supplies a decoding in-progress result v obtained as a result of the quasi variable node operation to the decoding in-progress result storing memory 410 to store the decoding in-progress result v in the decoding in-progress result storing memory 410.

Thus, the decoding device of FIG. 17 alternately performs the quasi check node operation by the quasi check node calculator 412 and the quasi variable node operation by the quasi variable node calculator 415, so that resultingly the check node operation and the variable node operation are performed alternately. Thereby an LDPC code is decoded.

Incidentally, in order to perform an adding process in which the block C integrates check node messages $u_j$ corresponding to edges in each column of the check matrix H, and adds received data $u_{0i}$ to a resulting integrated value, and perform a subtracting process, the variable node calculator 103 of FIG. 18 requires the FIFO memory 155. In the subtracting process, the block B subtracts a check node message $u_j$ from an edge for which a variable node message $v_i$ is desired to be obtained from a value obtained as a result of the adding process (an addition value obtained by adding the received data $u_{0i}$ to the integrated value of the check node messages $u_j$ corresponding to all the edges in each column of the check matrix H). The check node message $u_j$ is delayed by the FIFO memory 155 from the edge for which the variable node message $v_i$ is desired to be obtained until the integration of the check node messages $u_j$ corresponding to the edges in each column of the check matrix H is completed.

On the other hand, the block B' in the quasi check node calculator 412 of FIG. 19, as with the corresponding block B (FIG. 18), performs the subtracting process of subtracting the check node message $u_j$ from the edge for which the variable node message $v_i$ is desired to be obtained from the integrated value of the check node messages $u_j$ corresponding to all the edges in each column of the check matrix H. However, in the decoding device of FIG. 17, the edge memory 413 stores the check node message $u_j$, and the check node message $u_j$ (message D413) from the edge for which the variable node message $v_i$ is desired to be obtained is supplied from the edge memory 413 to the quasi check node calculator 412.

Thus, the decoding device of FIG. 17 does not require the FIFO memory 155 that delays the check node message $u_j$ from the edge for which the variable node message $v_i$ is desired to be obtained until the integration of the check node messages $u_j$ corresponding to the edges in each column of the check matrix H is completed. The decoding device of FIG. 17 can be reduced in size by an amount corresponding to the FIFO memory 155 as compared with the decoding device of FIG. 13.

The quasi check node operation performed in the quasi check node calculator 412 in FIG. 17 and the quasi variable node operation performed in the quasi variable node calculator 415 in FIG. 17 will next be described using equations.

The quasi check node calculator 412 performs the operation of the following Equation (8) (part of the variable node operation) and the operation of the above-described Equation (7) (check node operation) as quasi check node operation. The quasi check node calculator 412 supplies a check node message $u_j$ as a result of the quasi check node operation to the edge memory 413 to store the check node message $u_j$ in the edge memory 413. The quasi variable node calculator 415 performs the operation of the above-described Equation (5) (the other part of the variable node operation) as quasi variable node operation. The quasi variable node calculator 415 supplies a decoding in-progress result v as a result of the quasi variable node operation to the decoding in-progress result storing memory 410 to store the decoding in-progress result v in the decoding in-progress result storing memory 410.

[Equation 8]

$$v_i = v - u_{d_v} \quad (8)$$

Incidentally, $u_{d_v}$ in Equation (8) represents a result of check node operation from an edge for which a variable node message $v_i$ in an ith column of the check matrix H is to be obtained by the variable node operation. That is, $u_{d_v}$ is the check node message $u_j$ corresponding to the edge (the check node message $u_j$ from the edge) for which the variable node message $v_i$ is desired to be obtained by the variable node operation.

A decoding in-progress result v obtained as a result of the operation of the above-described Equation (5) is obtained by adding received data $u_{0i}$ to check node messages $u_j$ obtained as a result of check node operation from all edges corresponding to 1s in respective rows in an ith column of the check matrix H. Therefore, according to Equation (8), a variable node message $v_i$ for each edge can be obtained by subtracting a check node message $u_{d_v}$ from an edge for which the variable node message $v_i$ is to be obtained among the check node messages $u_j$ obtained by the check node operation from the edges corresponding to the 1s in the respective rows in the ith column of the check matrix H from such a decoding in-progress result v.

Hence, the variable node operation of Equation (1) for obtaining the variable node message $v_i$ can be divided into the operation of Equation (5) and the operation of Equation (8).

On the other hand, the check node operation for obtaining the check node message $u_j$ is expressed by Equation (7).

Hence, processing of the variable node operation of Equation (1) and the check node operation of Equation (7) is equivalent to processing of the operation of Equation (5) and the operations of Equation (8) and Equation (7).

Accordingly, the decoding device of FIG. 17 performs the operations of Equation (8) and Equation (7) (quasi check node operation) in the quasi check node calculator 412, and performs the operation of Equation (5) (quasi variable node operation) in the quasi variable node calculator 415, whereby an LDPC code is decoded.

Incidentally, a decoding in-progress result v obtained by the quasi variable node operation of Equation (5) results from adding a variable node message $v_i$ for each edge obtained as a result of the variable node operation of Equation (1) to a check node message $u_j$ from the edge corresponding to the variable node message $v_i$. Therefore only one decoding in-progress result v is obtained for one column (one variable node) of the check matrix H. Thus, decoding in-progress results v corresponding in number to a code length (the number of columns of the check matrix H) are obtained for received data $u_{0i}$ of the code length.

In the decoding device of FIG. 17, the quasi check node calculator 412 performs the quasi check node operation using a decoding in-progress result v corresponding to each column of the check matrix H as a result of the quasi variable node operation by the quasi variable node calculator 415. The quasi check node calculator 412 stores a check node message (a check node message output by each check node to each edge) $u_j$ obtained as a result of the quasi check node operation in the edge memory 413.

Hence, as in the case of the edge memory 102 in FIG. 13 for storing a result of the check node operation, a storage capacity necessary for the edge memory 413 is a value obtained by multiplying the number of 1s in the check matrix H (a total number of edges) by the number of quantization bits of the check node message $u_j$ (the number of bits of the normal quantization value in the present embodiment).

On the other hand, the quasi variable node calculator 415 performs the quasi variable node operation using received data $u_{0i}$ and check node messages $u_j$ corresponding to 1s in respective rows in an ith column of the check matrix H as a result of the quasi check node operation by the quasi check node calculator 412. The quasi variable node calculator 415 stores a decoding in-progress result v corresponding to the ith column which result is obtained as a result of the quasi variable node operation in the decoding in-progress result storing memory 410.

Hence, a storage capacity necessary for the decoding in-progress result storing memory 410 is a value obtained by multiplying the number of columns of the check matrix H, which number is smaller than the number of 1s in the check matrix H, that is, the code length of the LDPC code by the number of quantization bits of the decoding in-progress result v (the number of bits of the normal quantization value in the present embodiment).

From the above, in the decoding device of FIG. 17 for decoding an LDPC code with sparse 1s in the check matrix H, the storage capacity of the decoding in-progress result storing memory 410 can be reduced as compared with the edge memory 100 in FIG. 13, whereby the device scale of the decoding device of FIG. 17 can be reduced.

Further, the quasi variable node operation of Equation (5) performed by the quasi variable node calculator 415 in the decoding device of FIG. 17 is an operation for obtaining a final result of decoding an LDPC code in performing iterative decoding of the LDPC code by alternately repeating the check node operation and the variable node operation. The decoding device of FIG. 17 therefore does not require a block (not shown) that performs the operation of Equation (5) for obtaining the final result of decoding the LDPC code as in the decoding device of FIG. 13. Thus, the device scale of the decoding device of FIG. 17 can be reduced by an amount corresponding to such an unnecessary block as compared with the decoding device of FIG. 13.

Each part of the decoding device of FIG. 17 will next be described in detail.

The quasi variable node calculator 415 supplies the decoding in-progress result storing memory 410 with a decoding in-progress result D415 (v in Equation (5)) for each column of the check matrix H which result is obtained as a result of the quasi variable node operation of Equation (5). The decoding in-progress result storing memory 410 sequentially stores the decoding in-progress result D415 supplied from the quasi variable node calculator 415. The decoding in-progress result D415 for each column of the check matrix H which result is stored in the decoding in-progress result storing memory 410 is sequentially read from the decoding in-progress result storing memory 410 and then supplied to the switch 411.

The switch 411 is supplied with the decoding in-progress result D415 from the decoding in-progress result storing memory 410 and received data D417 ($u_{0i}$) from the receiver memory 416. The switch 411 selects one of the decoding in-progress result D415 supplied from the decoding in-progress result storing memory 410 and the received data D417 supplied from the receiver memory 416 according to a control signal D421 supplied from the controlling unit 417. The switch 411 supplies the selected one as a decoding in-progress result D411 to the quasi check node calculator 412.

Immediately after the received data D417 is stored in the receiver memory 416 (before a first quasi variable node operation using the received data D417 is performed after the received data D417 is stored), a decoding in-progress result D415 corresponding to the received data D417 is not stored in the decoding in-progress result storing memory 410. Therefore a quasi check node operation using the decoding in-progress result D415 cannot be performed. Accordingly, immediately after the received data D417 is stored in the receiver memory 416, the controlling unit 417 supplies a control signal D421 for giving an instruction to select the received data D417 to the switch 411. The switch 411 thereby selects the received data D417 supplied from the receiver memory 416, and then supplies the received data D417 as decoding in-progress result D411 to the quasi check node calculator 412. Therefore, in this case, the quasi check node calculator 412 performs the quasi check node operation using the received data D417 as decoding in-progress result v in Equation (8). Incidentally, while a check node message uj stored in the edge memory 413 is used in the quasi check node operation, the check node message uj in the edge memory 413 is initialized to zero when new received data D417 is stored in the receiver memory 416.

After the received data D417 is stored in the receiver memory 416 and the first quasi variable node operation using the received data D417 is performed (until a final decoding result corresponding to the received data D417 is output), a decoding in-progress result D415 corresponding to the received data D417 is stored in the decoding in-progress result storing memory 410, and therefore the controlling unit 417 supplies a control signal D421 for giving an instruction to select the decoding in-progress result D415 to the switch 411. The switch 411 thereby selects the decoding in-progress result D415 supplied from the decoding in-progress result storing memory 410, and then supplies the decoding in-progress result D415 as decoding in-progress result D411 to the quasi check node calculator 412. Therefore, in this case, the quasi check node calculator 412 performs the quasi check node operation using the decoding in-progress result D415 as decoding in-progress result v in Equation (8).

The quasi check node calculator 412 is supplied with the decoding in-progress result D411 as decoding in-progress result v in Equation (8) from the switch 411 and a check node message uj as a message D413 from the edge memory 413, the check node message uj being obtained as a result of a previous quasi check node operation by the quasi check node calculator 412. In addition, the quasi check node calculator 412 is supplied with a control signal D420 from the controlling unit 417.

The quasi check node calculator 412 performs the quasi check node operation, that is, the operation of Equation (8), using the decoding in-progress result D411 (v in Equation (8)) from the switch 411 and the message D413 (previous check node message uj). The quasi check node calculator 412 then performs the operation of Equation (7) to thereby obtain the check node message uj in Equation (7) for each edge (an element having a value of one) in the check matrix H. The quasi check node calculator 412 then supplies the edge memory 413 with the check node message uj for each edge as a message D412, the check node message uj being obtained as a result of the quasi check node operation of Equation (8) and Equation (7).

The edge memory 413 sequentially stores the message D412 for each edge supplied from the quasi check node calculator 412. The message D412 (uj) for each edge stored in the edge memory 413 is sequentially read from the edge memory 413 for a next quasi check node operation and a next quasi variable node operation, and then supplied as a message D413 to the quasi check node calculator 412 and the quasi variable node calculator 415.

The quasi variable node calculator 415 is supplied with the message D413 (check node message uj) for each edge from the edge memory 413. In addition, the quasi variable node calculator 415 is supplied with the received data D417 (u0i in Equation (5)) of an LDPC code from the receiver memory 416. Further, the quasi variable node calculator 415 is supplied with a control signal D422 from the controlling unit 417.

The quasi variable node calculator 415 performs the quasi variable node operation of Equation (5) for each column of the check matrix H using the message D413 (uj) for each edge from the edge memory 413 and the received data D417 (u0i) from the receiver memory 416 to thereby obtain a decoding in-progress result v for each column of the check matrix H. The quasi variable node calculator 415 then supplies the decoding in-progress result v obtained as a result of the quasi variable node operation of Equation (5) as a decoding in-progress result D415 to the decoding in-progress result storing memory 410.

As described above, the decoding in-progress result storing memory 410 sequentially stores the decoding in-progress result D415 supplied from the quasi variable node calculator 415. Further, the stored decoding in-progress result D415 is sequentially read from the decoding in-progress result storing memory 410 to be supplied to the switch 411.

However, when the quasi variable node calculator 415 has performed a final quasi variable node operation, that is, the quasi check node operation and the quasi variable node operation are repeated a predetermined number of times for the received data D417 stored in the receiver memory 416, for example, the decoding in-progress result storing memory 410 outputs a decoding in-progress result D415 as a result of the final quasi variable node operation as a final result of decoding the received data D417 (LDPC code) stored in the receiver memory 416.

The receiver memory 416 stores, as received data D417, a reception LLR (Log Likelihood Ratio) for a code length as a value of the likelihood of zero of each bit in the LDPC code calculated from a received signal D416 received through a communication channel. The receiver memory 416 supplies the received data D417 to the switch 411 and the quasi variable node calculator 415.

The controlling unit 417 controls the quasi check node calculator 412, the switch 411, and the quasi variable node calculator 415 by supplying the control signal D420 to the quasi check node calculator 412, the control signal D421 to the switch 411, and the control signal D422 to the quasi variable node calculator 415.

In the thus formed decoding device of FIG. 17, data makes a round through the decoding in-progress result storing memory 410, the quasi check node calculator 412, the edge memory 413, and the quasi variable node calculator 415 in this order, whereby one decoding operation (processing of one operation [the check node operation and the variable node operation] in iterative decoding) is performed. After repeating the decoding operation a predetermined number of times, the decoding device of FIG. 17 outputs a decoding in-progress result D415, which is a result of the quasi variable node operation by the quasi variable node calculator 415, as a final decoding result.

The quasi check node calculator 412 and the quasi variable node calculator 415 in FIG. 17 will next be described in more detail.

FIG. 19 shows an example of configuration of the quasi check node calculator 412 in FIG. 17.

The quasi check node calculator 412 is supplied with a decoding in-progress result D411 as a decoding in-progress result v in Equation (8) from the switch 411 (FIG. 17) and a check node message udv from an edge for which a variable node message vi is now to be obtained by Equation (8) among check node messages uj obtained as a result of previous quasi check node operation by the quasi check node calculator 412, the check node message udv being supplied as a message D413 from the edge memory 413 (FIG. 17). Further, the quasi check node calculator 412 is supplied with the control signal D420 from the controlling unit 417 (FIG. 17).

The decoding device of FIG. 17 performs the quasi check node operation and the quasi variable node operation repeatedly, and thereby equivalently performs the check node operation and the variable node operation repeatedly as with the decoding device of FIG. 13.

In the decoding device of FIG. 13, a message uj obtained by the check node operation and a message vi obtained by the variable node operation are both represented by a normal quantization value of six bits including a sign bit. Also in the decoding device of FIG. 17, a message uj and a message vi are both represented by a normal quantization value of six bits including a sign bit. The received data D417 stored in the receiver memory 416 in the decoding device of FIG. 17 is also represented by a normal quantization value of six bits including a sign bit as in the decoding device of FIG. 13.

In this case, the message D413 (check node message udv) supplied from the edge memory 413 (FIG. 17) to the quasi check node calculator 412 is represented by a six-bit normal quantization value. The decoding in-progress result D411 (v) supplied from the switch 411 (FIG. 17) to the quasi check node calculator 412 is represented by a nine-bit normal quantization value, as will be described later.

The message D413 (check node message udv from an edge for which a variable node message vi is now to be obtained by Equation (8) among check node messages uj obtained as a result of previous quasi check node operation) supplied from the edge memory 413 (FIG. 17) to the quasi check node calculator 412 and represented by a six-bit normal quantization value and the decoding in-progress result D411 (v) supplied from the switch 411 (FIG. 17) to the quasi check node calculator 412 and represented by a nine-bit normal quantization value are both supplied to an arithmetic unit 431 in the block B'.

The control signal D420 supplied from the controlling unit 417 (FIG. 17) to the quasi check node calculator 412 is supplied to a selector 435 and a selector 442.

The arithmetic unit 431 performs the operation of Equation (8), that is, subtracts the six-bit decoding in-progress result D413 (udv) supplied to the arithmetic unit 431 from the nine-bit decoding in-progress result D411 (v) supplied to the arithmetic unit 431. The arithmetic unit 431 thereby obtains a six-bit variable node message vi, and outputs the variable node message vi as a message D431 (vi) represented by a six-bit normal quantization value.

Incidentally, as with the arithmetic unit 156 forming the variable node calculator 103 in FIG. 12 described earlier, the arithmetic unit 431 clips the result of operation of Equation (8) when the operation result is outside a numerical range represented by the six-bit normal quantization value, and outputs the clipped operation result as the message D431 (vi) represented by the six-bit normal quantization value.

The six-bit message D431 (vi) output by the arithmetic unit 431 is supplied to the block A'. In the block A', a sign bit D432 (sign (vi)), which is the most significant bit of the six-bit message D431 (variable node message vi) from the arithmetic unit 431 and is a positive sign or a negative sign, is supplied to an EXOR circuit 440 and a FIFO memory 444, and an absolute value D433 (|vi|) of five less significant bits of the message D431 is supplied to a LUT 432.

As described above, the block A' corresponds to the block A in the check node calculator 171 shown in FIG. 14, and therefore performs the same processing as the block A.

Specifically, the LUT 432, an arithmetic unit 433, a register 434, the selector 435, a register 436, an arithmetic unit 437, a FIFO memory 438, a LUT 439, the EXOR circuit 440, a register 441, the selector 442, a register 443, the FIFO memory 444, and an EXOR circuit 445 in the block A' are formed in the same manner as the LUT 1121, the arithmetic unit 1122, the register 1123, the selector 1124, the register 1125, the arithmetic unit 1126, the FIFO memory 1127, the LUT 1128, the EXOR circuit 129, the register 130, the selector 131, the register 132, the FIFO memory 133, and the EXOR circuit 134, respectively, in the block A in FIG. 14.

In the block A', as in the block A in FIG. 14, the number of bits of parts indicated by a thick line in FIG. 19 is increased by four bits, which is a difference between the number of bits of a high-precision quantization value and the number of bits of a normal quantization value.

The LUT 432 in the block A' stores a result D434 ($\phi(|vi|)$) of the operation of the nonlinear function $\phi(|vi|)$ in Equation (7) in association with the five-bit absolute value D433 ($|vi|$). In the LUT 432, the absolute value D433 ($|vi|$) is represented by a normal quantization value, whereas the result D434 ($\phi(|vi|)$) of the operation of the nonlinear function $\phi(|vi|)$ is represented by a high-precision quantization value. That is, the LUT 432 stores for example the nine-bit result D434 ($\phi(|vi|)$) of the operation of the nonlinear function $\phi(|vi|)$ which result is represented by the high-precision quantization value in association with the five-bit absolute value D433 ($|vi|$) represented by the normal quantization value.

The LUT 432 reads the nine-bit result D434 ($\phi(|vi|)$) of the operation of the nonlinear function $\phi(|vi|)$ which result is represented by the high-precision quantization value and associated with the five-bit absolute value (absolute value represented by the five-bit normal quantization value) D433 ($|vi|$) as an input which value is represented by the normal quantization value. The LUT 432 outputs the nine-bit result D434 ($\phi(|vi|)$) of the operation of the nonlinear function $\phi(|vi|)$ to the arithmetic unit 433 and the FIFO memory 438.

Thus, the LUT 432 equivalently performs processing for calculating the nonlinear function $\phi(x)$ in Equation (7) and processing for converting the normal quantization value to the high-precision quantization value. Thereafter processing is performed using the high-precision quantization value until the LUT 439 to be described later converts the high-precision quantization value to the normal quantization value.

The arithmetic unit 433 integrates the nine-bit operation result D434 ($\phi(|vi|)$) by adding the operation result D434 to a 13-bit value D435 stored in the register 434. The arithmetic unit 433 re-stores a resulting 13-bit integrated value D435 in the register 434. Incidentally, when results of operation on the absolute values D433 ($|vi|$) of messages D431 (variable node messages vi) from all edges over one row of the check matrix H are integrated, the register 434 is reset.

The reason that the integrated value D435 output by the arithmetic unit 433 is 13 bits and the operation result D434 ($\phi(|vi|)$) input from the LUT 432 to the arithmetic unit 433 to be integrated is nine bits is the same as the reason that the output of the arithmetic unit 1122 in FIG. 14 is 13 bits, which are more by four bits than the nine bits of the operation result D1123 ($\phi(|vi|)$) input from the LUT 1121 to the arithmetic unit 1122.

When the messages D431 (variable node messages vi) over one row of the check matrix H are read one by one, and an integrated value obtained by integrating operation results D434 for one row is stored in the register 434, the control signal D420 supplied from the controlling unit 417 (FIG. 17) is changed from zero to one. For example, in a case where the row weight of the check matrix H is "9", the control signal D420 is "0" until an eighth operation result D434 is integrated, and the control signal D420 is "1" when a ninth operation result D434 is integrated.

When the control signal D420 is "1", the selector 435 selects the value stored in the register 434, that is, the 13-bit value D435 ($\Sigma\phi(|vi|)$) from i=1 to i=dc) obtained by integrating $\phi(|vi|)$ obtained from the messages D431 (variable node messages vi) from all the edges over one row of the check matrix H, and then outputs the value D435 as a 13-bit value D436 to the register 436 to store the value D436 in the register 436. The register 436 supplies the value D436 stored therein as a 13-bit value D437 to the selector 435 and the arithmetic unit 437. When the control signal D420 is "0", the selector 435 selects the value D437 supplied from the register 436, and then outputs the value D437 to the register 436 to re-store the value D437 in the register 436. That is, until $\phi(|vi|)$ obtained from the messages D431 (variable node messages vi) from all the edges over one row of the check matrix H is integrated, the register 436 supplies previously integrated $\phi(|vi|)$ to the selector 435 and the arithmetic unit 437.

Meanwhile, the FIFO memory 438 delays the nine-bit operation result D434 ($\phi(|vi|)$) output by the LUT 432 until the new value D437 ($\Sigma\phi(|vi|)$ from i=1 to i=dc) is output from the register 436, and then supplies the nine-bit operation result D434 ($\phi(|vi|)$) as a nine-bit value D438 to the arithmetic unit 437. The arithmetic unit 437 subtracts the nine-bit value D438 supplied from the FIFO memory 438 from the 13-bit value D437 supplied from the register 436. The arithmetic unit 437 supplies a result of the subtraction as a nine-bit subtraction value D439 to the LUT 439. That is, the arithmetic unit 437 subtracts $\phi(|vi|)$ obtained from a message D431 (variable node message vi) from an edge for which a check node message uj is desired to be obtained from the integrated value of $\phi(|vi|)$ obtained from the messages D431 (variable node messages vi) from all the edges over one row of the check matrix H. The arithmetic unit 437 supplies the subtraction value ($\Sigma\phi(|vi|)$ from i=1 to i=dc−1) as the subtraction value D439 to the LUT 439.

Incidentally, when a quantization value (high-precision quantization value) as the result of the subtraction of the nine-bit value D438 supplied from the FIFO memory 438 from the 13-bit value D437 supplied from the register 436 exceeds a maximum value that can be represented by the nine-bit subtraction value D439, the arithmetic unit 437 clips the high-precision quantization value as the result of the subtraction to the maximum value that can be represented by the nine-bit high-precision quantization value, and then outputs the nine-bit subtraction value D439.

The LUT 439 stores an operation result D440 ($\phi{-}1(\Sigma\phi(|vi|))$) obtained by performing the operation of the inverse function $\phi{-}1(\Sigma\phi(|vi|))$ in Equation (7) in association with the subtraction value D439 ($\Sigma\phi(|vi|)$ from i=1 to i=dc−1). In the LUT 439, the subtraction value D439 ($\Sigma\phi(|vi|)$ from i=1 to i=dc−1) is represented by the high-precision quantization value, whereas the operation result D440 ($\phi{-}1(\Sigma\phi(|vi|))$) obtained by performing the operation of the inverse function $\phi{-}1(\Sigma\phi(|vi|))$ is represented by the normal quantization value. That is, the LUT 439 stores the five-bit operation result D440 ($\phi{-}1(\Sigma\phi(|vi|))$) obtained by performing the operation of the inverse function $\phi{-}1(\Sigma\phi(|vi|))$, the operation result D440 being represented by the normal quantization value, in association with the nine-bit subtraction value D439 ($\Sigma\phi(|vi|)$ from i=1 to i=dc−1) represented by the high-precision quantization value.

The LUT 439 reads the five-bit operation result D440 ($\phi{-}1(\Sigma\phi(|vi|))$) of the operation of the inverse function $\phi{-}1$ ($\Sigma\phi(|vi|)$), the operation result D440 being represented by the normal quantization value, in association with the nine-bit subtraction value D439 ($\Sigma\phi(|vi|)$ from i=1 to i=dc−1) represented by the high-precision quantization value as an input, and then outputs the five-bit operation result D440 ($\phi{-}1(\Sigma\phi(|vi|))$).

Thus, the LUT 439 equivalently performs processing for calculating the inverse function $\phi-1(\Sigma\phi(|vi|))$ and processing for converting the high-precision quantization value to the normal quantization value. Thereafter processing is performed using the normal quantization value until the LUT 432 described above converts the normal quantization value to the high-precision quantization value.

In parallel with the above processing, the EXOR circuit 440 calculates an exclusive OR of a one-bit value D442 stored in the register 441 and the sign bit D432, and thereby multiplies the sign bits together. The EXOR circuit 440 re-stores a one-bit multiplication result D441 in the register 441. Incidentally, when the sign bits D432 of the variable node messages vi (D431) obtained from the decoding in-progress results D411 corresponding to all is over one row of the check matrix H are multiplied together, the register 441 is reset.

When a multiplication result D441 (Πsign(vi) from i=1 to dc) obtained by multiplying together the sign bits D432 of the variable node messages vi (D431) obtained from the decoding in-progress results D411 corresponding to all the 1s over one row of the check matrix H is stored in the register 441, the control signal D420 supplied from the controlling unit 417 is changed from zero to one.

When the control signal D420 is "1", the selector 442 selects the value stored in the register 441, that is, the value D442 (Πsign(vi) from i=1 to i=dc) obtained by multiplying together the sign bits D432 obtained from the decoding in-progress results D411 corresponding to all the 1s over one row of the check matrix H, and then outputs the value D442 as a one-bit value D443 to the register 443 to store the value D443 in the register 443. The register 443 supplies the value D443 stored therein as a one-bit value D444 to the selector 442 and the EXOR circuit 445. When the control signal D420 is "0", the selector 442 selects the value D444 supplied from the register 443, and then outputs the value D444 to the register 443 to re-store the value D444 in the register 443. That is, until the sign bits D432 of the variable node messages vi (D431) obtained from the decoding in-progress results D411 (decoding in-progress results v) corresponding to all the 1s over one row of the check matrix are multiplied together, the register 443 supplies a previously stored value to the selector 442 and the EXOR circuit 445.

Meanwhile, the FIFO memory 444 delays the sign bit D432 until the new value D444 (Πsign(vi) from i=1 to i=dc) is output from the register 443 to the EXOR circuit 445, and then supplies the sign bit D432 as a one-bit value D445 to the EXOR circuit 445. The EXOR circuit 445 calculates an exclusive OR of the value D444 supplied from the register 443 and the value D445 supplied from the FIFO memory 444, and thereby divides the value D444 by the value D445. The EXOR circuit 445 then outputs a one-bit division result as a divided value D446. That is, the EXOR circuit 445 divides the value obtained by multiplying together the sign bits D432 (sign (vi)) of the variable node messages vi (D431) obtained from the decoding in-progress results D411 corresponding to all the 1s over one row of the check matrix by a sign bit D432 (sign (vi)) of a variable node message vi (D431) from an edge for which a check node message uj is to be obtained. The EXOR circuit 445 supplies the divided value (Πsign(vi) from i=1 to i=dc−1) as the divided value D446.

The quasi check node calculator 412 then outputs a message D412 (check node message uj) represented by a normal quantization value of a total of six bits with the five-bit operation result D440 of the normal quantization value output from the LUT 439 as five less significant bits and the one-bit divided value D446 output from the EXOR circuit 445 as a most significant bit (sign bit).

As described above, the quasi check node calculator 412 performs the operations of Equation (7) and Equation (8), and obtains the check node message uj represented by the six-bit normal quantization value as a result of the check node operation. This check node message uj is supplied from the quasi check node calculator 412 to the edge memory 413 (FIG. 17) to be stored in the edge memory 413.

Incidentally, since the maximum row weight of the check matrix of FIG. 9 is nine, the quasi check node calculator 412 has the FIFO memory 438 for delaying nine operation results D434 ($\phi(|vi|)$) obtained from nine decoding in-progress results D411 and the FIFO memory 444 for delaying nine sign bits D432. When a check node message uj for a row with a row weight of less than nine is to be calculated, an amount of delay in the FIFO memory 438 and the FIFO memory 444 is reduced to the value of the row weight.

FIG. 20 shows an example of configuration of the quasi variable node calculator 415 in FIG. 17.

The quasi variable node calculator 415 is formed by the block C'. As described above, the block C' corresponds to the block C in the variable node calculator 103 shown in FIG. 18, and therefore the block C' performs the same processing as the block C.

Specifically, an arithmetic unit 471, a register 472, a selector 473, a register 474, and an arithmetic unit 475 in the block C' are formed in the same manner as the arithmetic unit 151, the register 152, the selector 153, the register 154, and the arithmetic unit 1561, respectively, in the block C in FIG. 18.

A message D413 (check node message uj) as a result of check node operation is supplied from the edge memory 413 (FIG. 17) to the quasi variable node calculator 415. The message D413 is supplied to the arithmetic unit 471. In addition, received data D417 (u0i) is supplied from the receiver memory 416 (FIG. 17) to the quasi variable node calculator 415. The received data D417 is supplied to the arithmetic unit 475. Further, a control signal D422 is supplied from the controlling unit 417 (FIG. 17) to the quasi variable node calculator 415. The control signal D422 is supplied to the selector 473.

The message D413 (check node message uj) supplied from the edge memory 413 (FIG. 17) to the quasi variable node calculator 415 and the received data D417 (u0i) supplied from the receiver memory 416 (FIG. 17) to the quasi variable node calculator 415 are both represented by a six-bit normal quantization value, as described above.

The arithmetic unit 471 integrates the message D413 (check node message uj) by adding the message D413 to a nine-bit value D471 stored in the register 472. The arithmetic unit 471 re-stores a resulting nine-bit integrated value in the register 472. Incidentally, when messages D413 (check node messages uj) corresponding to all the is over one column of the check matrix are integrated, the register 472 is reset.

The reason that the integrated value output by the arithmetic unit 471 is nine bits and the message D413 (uj) input to the arithmetic unit 471 and then integrated is six bits is the same as the reason that the output of the arithmetic unit 151 in FIG. 12 is nine bits, which is three bits more than the six bits of the message D103 input to the arithmetic unit 151.

When a value obtained by integrating the messages D413 for one column is stored in the register 472, the control signal D422 supplied from the controlling unit 417 (FIG. 17) is changed from zero to one. For example, in a case where a column weight is "5", the control signal D422 is "0" until a fourth message D413 is integrated, and the control signal D422 is "1" when a fifth message D413 is integrated.

When the control signal D422 is "1", the selector 473 selects the value stored in the register 472, that is, the nine-bit integrated value D471 (Σuj from j=1 to dV) obtained by integrating the messages D413 (check node messages uj) from all edges over one column of the check matrix H, and then outputs the integrated value D471 to the register 474 to store the integrated value D471 in the register 474. The register 474 supplies the integrated value D471 stored therein as a nine-bit value D472 to the selector 473 and the arithmetic unit 475. When the control signal D420 is "0", the selector 473 selects the nine-bit value D472 supplied from the register 474, and then outputs the value D472 to the register 474 to re-store the value D472 in the register 474. That is, until the messages D431 (variable node messages vj) from all the edges over one column of the check matrix are integrated, the register 474 supplies a previous integrated value D472 to the selector 473 and the arithmetic unit 475.

The arithmetic unit 475 adds the nine-bit integrated value D472 to the six-bit received data D417 supplied from the receiver memory 416 (FIG. 17). The arithmetic unit 475 outputs a nine-bit value obtained as a result of the addition as a decoding in-progress result D415 (decoding in-progress result v).

As described above, the quasi variable node calculator 415 performs the operation of Equation (5) while using the normal quantization value without converting the normal quantization value into the high-precision quantization value, and thereby obtains a nine-bit decoding in-progress result v. The decoding in-progress result v is supplied from the quasi variable node calculator 415 to the decoding in-progress result storing memory 410 (FIG. 17) to be stored in the decoding in-progress result storing memory 410.

Incidentally, the decoding in-progress result storing memory 410 stores the decoding in-progress result v represented by the nine-bit normal quantization value, and the nine-bit decoding in-progress result v is supplied to the quasi check node calculator 412 via the switch 411 (FIG. 17), as described above.

As with the decoding device of FIG. 13, the decoding device of FIG. 17 converts the normal quantization value to the high-precision quantization value in the LUT 321 in the quasi check node calculator 412, and converts the high-precision quantization value to the normal quantization value in the LUT 439. The decoding device thereby uses the high-precision quantization value in processing from after the operation of the nonlinear function φ(x) to the operation of the inverse function φ−1(x) of the nonlinear function φ(x) in processing performed as the check node operation and the variable node operation, and uses the normal quantization value in the other processing. It is therefore possible to decode the LDPC code with a high precision while preventing an increase in scale of the decoding device.

Further, in the decoding device of FIG. 17, the quasi check node calculator 412 performs the check node operation and a part of the variable node operation, and the quasi variable node calculator 415 performs the other part of the variable node operation. Therefore the decoding device of FIG. 17 can be smaller in device scale than the decoding device of FIG. 13.

Specifically, in the decoding device of FIG. 17, the edge memory 413 corresponds to the edge memory 102 in FIG. 13, the decoding in-progress result storing memory 410 corresponds to the edge memory 100 in FIG. 13, and the receiver memory 416 corresponds to the receiver memory 104 in FIG. 13.

The edge memory 413 in FIG. 17 and the corresponding edge memory 102 in FIG. 13 both need to store six-bit check node messages uj equal in number to a total number of edges and therefore require a storage capacity of six bits multiplied by the total number of edges. The receiver memory 416 in FIG. 17 and the corresponding receiver memory 104 in FIG. 13 both need to store pieces of six-bit received data u0i equal in number to a code length and therefore require a storage capacity of six bits multiplied by the code length.

As with the edge memory 102 in FIG. 13, the edge memory 100 in FIG. 13 needs to store six-bit variable node messages vi equal in number to the total number of edges and therefore requires a storage capacity of six bits multiplied by the total number of edges.

On the other hand, the decoding in-progress result storing memory 410 in FIG. 17 corresponding to the edge memory 100 in FIG. 13 needs to store decoding in-progress results v (D415) output by the quasi variable node calculator 415 which results are equal in number to the code length. Since a decoding in-progress result v is nine bits (a normal quantization value of nine bits), as described with reference to FIG. 20, the decoding in-progress result storing memory 410 needs a storage capacity of nine bits multiplied by the code length.

Hence, when the total number of edges is 3/2 (=nine bits/six bits) of the code length, the decoding in-progress result storing memory 410 and the corresponding edge memory 100 in FIG. 13 need a same storage capacity.

However, while the check matrix H of the LDPC code is sparse, the total number of edges (a total number of elements having a value of one in the check matrix H) is generally larger than 3/2 of the code length (the number of columns in the check matrix H). For example, also in the case of the check matrix H of FIG. 9, the total number of edges (323) is about three (≈323/108) times the code length (108).

Thus, the storage capacity of the decoding in-progress result storing memory 410 can be reduced as compared with the storage capacity of the corresponding edge memory 100 in FIG. 13.

As a result, the decoding device of FIG. 17 can be reduced in device scale as compared with the decoding device of FIG. 13 by an amount corresponding to a reduction of the storage capacity of the decoding in-progress result storing memory 410 as compared with the storage capacity of the corresponding edge memory 100 in FIG. 13.

In addition, as described above, the decoding device of FIG. 17 does not need a block for calculating Equation (5) (in addition to the quasi variable node calculator 415), and does not need the FIFO memory 155 in FIG. 18 (FIG. 12). Therefore the decoding device of FIG. 17 can be made even smaller than the decoding device of FIG. 13.

A first decoding method for decoding an LDPC code by repeatedly performing the check node operation represented by Equation (7) and the variable node operation represented by Equation (1) is equivalent to a second decoding method for decoding an LDPC code by repeatedly performing the quasi check node operation represented by Equation (8) and Equation (7) and the quasi variable node operation represented by Equation (5).

The operation of Equation (7) is performed in both of the first decoding method and the second decoding method. This Equation (7) can be resolved into three equations, that is, Equation (9), Equation (10), and Equation (11).

[Equation 9]

$$V_i = \phi(|v_i|) \quad (9)$$

-continued

[Equation 10]

$$W = \sum_{i=1}^{d_c-1} V_i \quad (10)$$

[Equation 11]

$$u_j = \phi^{-1}(W) \times \prod_{i=1}^{d_c-1} \text{sign}(v_i) \quad (11)$$

By calculating Equations (9) to (11) in this order, it is possible to perform the operation of Equation (7), that is, the check node operation.

When Equations (9) to (11) are calculated in this order, and the process of the calculation is divided into an "inside" and an "outside" from the nonlinear function $\phi(|vi|)$ calculated by Equation (9) to the inverse function $\phi(W)$ calculated by Equation (11), variables (messages) vi and uj are used only on the "outside" in the operations of Equations (9) to (11), and variables Vi and W are used only on the "inside".

Different numerical values can therefore be assigned to quantization values representing the variables vi and uj used only on the "outside" and to quantization values representing the variables Vi and W used only on the "inside".

Accordingly, the decoding devices of FIG. 13 and FIG. 17 use a normal quantization value representing a numerical value in a dynamic range Dy with a quantization width Q as the quantization values representing the variables vi and uj, and use a high-precision quantization value representing a numerical value in a dynamic range wider than the dynamic range Dy with a quantization width smaller than the quantization width Q as the quantization values representing the variables Vi and W. That is, the high-precision quantization value is used in processing from after the operation of the nonlinear function $\phi(x)$ to the operation of the inverse function $\phi-1(x)$ of the nonlinear function $\phi(x)$ ("inside") in processing performed as the check node operation and the variable node operation, and the normal quantization value is used in the other processing ("outside").

It is thereby possible to decode an LDPC code with a higher precision while preventing an increase in scale of the decoding devices. In other words, in decoding an LDPC code with a certain precision (performance), the scale of the decoding devices can be reduced greatly.

FIG. 21 shows results of BER/FER simulation on various decoding devices.

Incidentally, in FIG. 21, an axis of abscissas indicates a signal power to noise power ratio Eb/N0 per bit, and an axis of ordinates indicates a BER (Bit Error Rate) or an FER (Frame Error Rate). In FIG. 21, the BER is indicated by a solid line, and the FER is indicated by a dotted line.

Cross marks in FIG. 21 represent the BER and the FER when the decoding device of FIG. 10 decodes an LDPC code with messages uj and vi and received data u0i represented by a six-bit normal quantization value.

Triangle marks in FIG. 21 represent the BER and the FER when the decoding device of FIG. 10 decodes an LDPC code with messages uj and vi and received data u0i represented by a 10-bit high-precision quantization value.

As is understood from a comparison between the BER and the FER represented by the cross marks and the BER and the FER represented by the triangle marks, the BER and the FER when messages uj and vi and received data u0i are represented by a 10-bit high-precision quantization value are dramatically improved as compared with the BER and the FER when messages uj and vi and received data u0i are represented by a six-bit normal quantization value. Conversely, the BER and the FER when messages uj and vi and received data u0i are represented by a six-bit normal quantization value are degraded greatly as compared with the BER and the FER when messages uj and vi and received data u0i are represented by a 10-bit high-precision quantization value.

However, when messages uj and vi and received data u0i are represented by a six-bit normal quantization value, device scale can be reduced by 40 percent regarding only memories storing messages uj and vi and received data u0i as compared with the case where messages uj and vi and received data u0i are represented by a 10-bit high-precision quantization value. This is because the storage capacities of the memories storing messages uj and vi and received data u0i are proportional to the numbers of quantization bits of the messages uj and vi and the received data u0i.

On the other hand, circle marks in FIG. 21 represent the BER and the FER when the decoding device of FIG. 13 decodes an LDPC code with messages uj and vi and received data u0i represented by a six-bit normal quantization value, with the LUT 1121 (FIG. 14) converting a six-bit normal quantization value to a 10-bit high-precision quantization value, and with the LUT 1128 (FIG. 14) converting a 10-bit high-precision quantization value to a six-bit normal quantization value.

The decoding device of FIG. 13 can offer a performance (precision) substantially equal to that when messages uj and vi and received data u0i are represented by a 10-bit high-precision quantization value.

Further, since the decoding device of FIG. 13 represents messages uj and vi and received data u0i by a six-bit normal quantization value, the device scale of the decoding device of FIG. 13 can be made substantially equal to that of the decoding device of FIG. 10 which represents messages uj and vi and received data u0i by a six-bit normal quantization value.

That is, compared with the decoding device of FIG. 10 which represents messages uj and vi and received data u0i by a six-bit normal quantization value, the decoding device of FIG. 13 can perform decoding with a higher precision on a scale equal to that of the decoding device of FIG. 10.

In addition, compared with the decoding device of FIG. 10 which represents messages uj and vi and received data u0i by a 10-bit high-precision quantization value, the decoding device of FIG. 13 can achieve a performance equal to that of the decoding device of FIG. 10 on a smaller device scale, that is, with the memories storing the received data u0i and the like reduced by 40 percent, as described above.

When the code length of LDPC codes is increased, the scale of the memories storing the received data u0i and the like becomes dominant in terms of the scale of the decoding device as a whole, and the memories storing the received data u0i and the like may account for 80 percent or more of the scale of the decoding device in some cases. Therefore the reduction of the memories storing the received data u0i and the like has very great effects.

It is to be noted that while in the present embodiment, a decoding device having a full serial decoding architecture in which operations at nodes are sequentially performed one by one is employed, the architecture of the decoding device is not particularly limited. That is, the present invention is applicable to not only decoding devices having the full serial decoding architecture but also for example decoding devices having a full parallel decoding architecture in which operations at all nodes are performed simultaneously and decoding devices having a partly parallel decoding architecture in which operations at a certain number of nodes rather than one node or all nodes are performed simultaneously.

Further, the check matrix H is not limited to the check matrix H shown in FIG. 9.

In addition, the numbers of bits (numbers of quantization bits) of data (for example messages uj and vi, received data u0i, decoding in-progress results v, and the like) represented by normal quantization values and high-precision quantization values are not limited to the above-described values.

Further, a RAM (Random Access Memory), for example, can be used as the edge memories 100 and 102 and the receiver memory 104 in FIG. 13, and the decoding in-progress result storing memory 410, the edge memory 413, and the receiver memory 416 in FIG. 17. The number of bits (bit width) per word in a RAM used as the edge memory 100 and the like and the number of words that can be stored by the RAM are not particularly limited. Depending on the bit width and the number of words in the RAM, a plurality of RAMs can be regarded as one logical RAM and used as the edge memory 100 or the like by giving a similar control signal (for example a chip selecting signal or an address signal) to the plurality of RAMs. That is, when the bit width of one physical RAM falls short of the number of quantization bits of received data u0i or the like, for example, a plurality of RAMs can be regarded as one logical RAM to store the received data u0i or the like.

In addition, in the present embodiment, LUTs such as the LUT 1121 (FIG. 14) and the LUT 432 (FIG. 19) or the LUT 1128 (FIG. 14) and the LUT 439 (FIG. 19) convert a normal quantization value to a high-precision quantization value, or convert a high-precision quantization value to a normal quantization value. However, the conversion from one of the normal quantization value and the high-precision quantization value to the other can be performed by a conversion circuit provided separately from the LUTs. In this case, in FIG. 14, for example, a conversion circuit for converting a normal quantization value to a high-precision quantization value is provided at a position immediately preceding the input of the LUT 1121, and a conversion circuit for converting a high-precision quantization value to a normal quantization value is provided at a position immediately succeeding the output of the LUT 1128.

However, when the conversion from one of the normal quantization value and the high-precision quantization value to the other is performed by the LUTs, device scale can be reduced because it is not necessary to provide the conversion circuits separately from the LUTs.

Further, while in the present embodiment, the operation of the nonlinear function $\phi(x)$ or the inverse function $\phi^{-1}(x)$ of the nonlinear function $\phi(x)$ is performed by LUTs such as the LUT 1121 (FIG. 14) and the LUT 432 (FIG. 19) or the LUT 1128 (FIG. 14) and the LUT 439 (FIG. 19), the operation of the nonlinear function $\phi(x)$ or the inverse function $\phi^{-1}(x)$ of the nonlinear function $\phi(x)$ can be performed by a CPU (Central Processing Unit) or a logical circuit, for example.

The above-described decoding device for decoding an LDPC code is applicable to a tuner for receiving (digital) satellite broadcasts, for example.

It should be understood by those skilled in the art that various modifications, combinations, sub-combinations and alterations may occur depending on design requirements and other factors insofar as they are within the scope of the appended claims or the equivalents thereof.

What is claimed is:

1. A decoding device for decoding an LDPC (Low Density Parity Check) code, said decoding device comprising:
   a first operation unit for performing a check node operation for decoding said LDPC code, said operation including an operation of a nonlinear function and an operation of an inverse function of said nonlinear function; and
   a second operation unit for performing a variable node operation for decoding said LDPC code;
   wherein said first operation unit includes
   a first converting unit for converting a first quantization value assigned to a numerical value into a second quantization value representing a numerical value with a higher precision than said first quantization value, and
   a second converting unit for converting said second quantization value into said first quantization value, and
   in processing performed as said check node operation and said variable node operation, said first operation unit and said second operation unit use said second quantization value in processing from after the operation of said nonlinear function to before the operation of said inverse function, and use said first quantization value in the other processing.

2. The decoding device as claimed in claim 1,
   wherein said first operation unit performs said check node operation and a part of said variable node operation; and
   said second operation unit performs another part of said variable node operation.

3. The decoding device as claimed in claim 1,
   wherein said second quantization value represents a numerical value in a dynamic range narrower than a dynamic range of a numerical value represented by said first numerical value.

4. The decoding device as claimed in claim 1,
   wherein said second quantization value has a smaller quantization width than said first numerical value.

5. The decoding device as claimed in claim 1,
   wherein said second quantization value has a larger number of bits than said first numerical value.

6. The decoding device as claimed in claim 1,
   wherein said first converting unit is a LUT (Look Up Table) that receives said first numerical value as an input and outputs a result of calculating said nonlinear function by said second quantization value; and
   said second converting unit is a LUT that receives said second numerical value as an input and outputs a result of calculating said inverse function by said first quantization value.

7. A decoding method of a decoding device for decoding an LDPC (Low Density Parity Check) code, said decoding device including
   a first operation unit for performing a check node operation at a check node for decoding said LDPC code, said check node operation including an operation of a nonlinear function and an operation of an inverse function of said nonlinear function, and
   a second operation unit for performing a variable node operation at a variable node for decoding said LDPC code, said decoding method comprising:
   a first converting step for converting a first quantization value assigned to a numerical value into a second quantization value representing a numerical value with a higher precision than said first quantization value; and
   a second converting step for converting said second quantization value into said first quantization value;
   wherein in processing performed as said check node operation and said variable node operation, said first operation unit and said second operation unit use said second quantization value in processing from after the operation of said nonlinear function to the operation of said inverse function, and use said first quantization value in the other processing.

* * * * *